US 11,079,686 B2

(12) United States Patent
Ishida et al.

(10) Patent No.: US 11,079,686 B2
(45) Date of Patent: Aug. 3, 2021

(54) EXCIMER LASER APPARATUS AND ELECTRONIC-DEVICE MANUFACTURING METHOD

(71) Applicant: Gigaphoton Inc., Tochigi (JP)

(72) Inventors: Keisuke Ishida, Oyama (JP); Masato Moriya, Oyama (JP); Natsuhiko Kouno, Oyama (JP); Takeshi Asayama, Oyama (JP); Takashi Kusama, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/871,758

(22) Filed: May 11, 2020

(65) Prior Publication Data

US 2020/0274315 A1 Aug. 27, 2020

Related U.S. Application Data

(63) Continuation of application No. PCT/JP2017/043600, filed on Dec. 5, 2017.

(51) Int. Cl.
*G03F 7/20* (2006.01)
*G01J 3/26* (2006.01)
(Continued)

(52) U.S. Cl.
CPC ............ *G03F 7/70575* (2013.01); *G01J 3/26* (2013.01); *G03F 7/70025* (2013.01);
(Continued)

(58) Field of Classification Search
CPC .... G03F 7/70; G03F 7/70008; G03F 7/70025; G03F 7/70041; G03F 7/7005;
(Continued)

(56) References Cited

U.S. PATENT DOCUMENTS 6,317,448 B1 11/2001 Das et al.
7,256,893 B2 8/2007 Rafac
(Continued)

FOREIGN PATENT DOCUMENTS

JP S63-29758 A 2/1988
JP 2003-243752 A 8/2003
(Continued)

OTHER PUBLICATIONS

International Search Report issued in PCT/JP2017/043600; dated Feb. 20, 2018.
(Continued)

*Primary Examiner* — Christina A Riddle
(74) *Attorney, Agent, or Firm* — Studebaker & Brackett PC

(57) ABSTRACT

An excimer laser apparatus according to the present disclosure includes an etalon spectrometer configured to measure a fringe waveform of a laser beam; and a controller configured to obtain area of a first ratio in a spectral space obtained based on a result of the measurement by the etalon spectrometer, calculate a first spectral line width of the laser beam based on the obtained area of the first ratio, and calibrate a first spectral line width based on a correlation function representing correlation between the first spectral line width and a second spectral line width of the laser beam measured by a reference meter.

18 Claims, 16 Drawing Sheets

(51) Int. Cl.
*H01S 3/036* (2006.01)
*H01S 3/104* (2006.01)
*H01S 3/225* (2006.01)

(52) U.S. Cl.
CPC .............. *H01S 3/036* (2013.01); *H01S 3/104* (2013.01); *H01S 3/225* (2013.01)

(58) Field of Classification Search
CPC .. G03F 7/70483; G03F 7/70491; G03F 7/705; G03F 7/70508; G03F 7/70516–70541; G03F 7/7055; G03F 7/70583; G03F 7/7085; G03F 7/70575; G03F 7/70725; H01S 3/225; H01S 3/036; H01S 3/104; H01S 3/08009; H01S 3/08031; H01S 3/137; H01S 3/134; H01S 3/0014; H01S 3/1062; H01S 3/1305; H01S 3/1306; H01S 3/1394; G01J 3/26; G01J 3/4257; G01J 9/00; G01J 9/02; G01J 9/0246; G01J 2009/004; G01J 2009/0234; G01J 2009/0242; G01J 2009/0249; G01J 2009/0253; G01J 2009/0257
USPC .............. 355/52–55, 67–71, 77; 430/22, 30; 356/450, 454, 519; 372/5, 9, 20, 25, 372/29.01–29.016, 29.02–32, 55, 57, 109, 372/705
See application file for complete search history.

(56) References Cited

U.S. PATENT DOCUMENTS

| | | | |
|---|---|---|---|
| 7,304,748 | B2 | 12/2007 | Rafac |
| 7,639,364 | B2 | 12/2009 | Rafac |
| 7,684,046 | B2 | 3/2010 | Rafac |
| 2003/0161373 | A1* | 8/2003 | Kitatochi ................. H01S 3/22 372/55 |
| 2007/0013913 | A1 | 1/2007 | Rafac |
| 2008/0285602 | A1* | 11/2008 | Nagai ................... H01S 3/2366 372/20 |
| 2018/0254600 | A1 | 9/2018 | Kumazaki et al. |

FOREIGN PATENT DOCUMENTS

| | | |
|---|---|---|
| JP | 2004-271498 A | 9/2004 |
| JP | 2009-505116 A | 2/2009 |
| JP | 2009-267097 A | 11/2009 |
| WO | 2006/006499 A1 | 1/2006 |
| WO | 2017/098625 A1 | 6/2017 |

OTHER PUBLICATIONS

International Preliminary Report on Patentability and Written Opinion issued in PCT/JP2017/043600; dated Jun. 9, 2020.

* cited by examiner

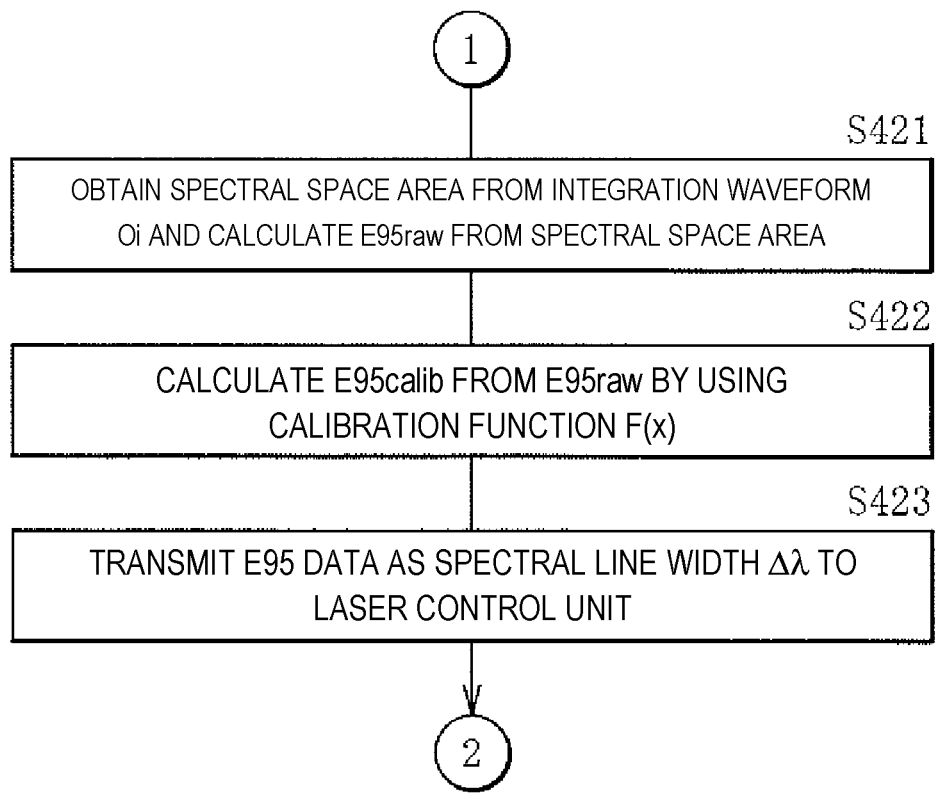

EXCIMER LASER APPARATUS AND ELECTRONIC-DEVICE MANUFACTURING METHOD

CROSS-REFERENCE TO RELATED APPLICATIONS

The present application is a continuation application of International Application No. PCT/JP2017/043600, filed on Dec. 5, 2017, the entire contents of which are hereby incorporated by reference.

BACKGROUND

1. Technical Field

The present disclosure relates to an excimer laser apparatus and an electronic-device manufacturing method.

2. Related Art

Recently, in a semiconductor exposure apparatus (hereinafter referred to as "exposure apparatus"), resolving power improvement has been requested along with miniaturization and high integration of a semiconductor integrated circuit. Thus, the wavelength of light discharged from an exposure light source has been shortened. Typically, a gas laser apparatus is used as the exposure light source in place of a conventional mercury lamp. Examples of the gas laser apparatus for exposure include a KrF excimer laser apparatus configured to output an ultraviolet laser beam having a wavelength of 248 nm, and an ArF excimer laser apparatus configured to output an ultraviolet laser beam having a wavelength of 193 nm.

Immersion exposure in which a space between an exposure lens on the exposure apparatus side and a wafer is filled with liquid has been practically used as a next generation exposure technology. In the immersion exposure, the apparent wavelength of the exposure light source is shortened due to change of the refractive index of the space between the exposure lens and the wafer. When the immersion exposure is performed by using the ArF excimer laser apparatus as the exposure light source, the wafer is irradiated with ultraviolet light having a wavelength of 134 nm in the water. This technology is called ArF immersion exposure (or ArF immersion lithography).

The KrF excimer laser apparatus and the ArF excimer laser apparatus each have a wide spontaneous oscillation width of 350 pm to 400 pm approximately. Thus, chromatic aberration occurs in some cases when a projection lens is made of a material that transmits ultraviolet such as KrF and ArF laser beams. This can lead to resolving power decrease. Thus, the spectral line width of a laser beam output from the gas laser apparatus needs to be narrowed so that chromatic aberration becomes negligible. To narrow the spectral line width, a line narrow module (LNM) including a line narrow element (for example, etalon or grating) is provided in a laser resonator of the gas laser apparatus in some cases. In the following, a laser apparatus that achieves narrowing of the spectral line width is referred to as a line narrow laser apparatus.

LIST OF DOCUMENTS

Patent Documents

Patent Document 1: Japanese Unexamined Patent Application Publication No. 2004-271498
Patent Document 2: Japanese Unexamined Patent Application Publication No. 63-29758
Patent Document 3: U.S. Pat. No. 7,256,893
Patent Document 4: U.S. Pat. No. 7,304,748
Patent Document 5: U.S. Pat. No. 7,684,046
Patent Document 6: U.S. Pat. No. 7,639,364

SUMMARY

An excimer laser apparatus of the present disclosure includes an etalon spectrometer configured to measure a fringe waveform of a laser beam; and a controller configured to obtain area of a first ratio in a spectral space obtained based on a result of the measurement by the etalon spectrometer, calculate a first spectral line width of the laser beam based on the obtained area of the first ratio, and calibrate the first spectral line width based on a correlation function representing correlation between the first spectral line width and a second spectral line width of the laser beam measured by a reference meter.

An electronic-device manufacturing method of the present disclosure includes: generating a laser beam by a laser system; outputting the laser beam to an exposure apparatus; and exposing a photosensitive substrate to the laser beam by the exposure apparatus to manufacture an electronic device, the laser system including: an etalon spectrometer configured to measure a fringe waveform of the laser beam; and a controller configured to obtain area of a first ratio in a spectral space obtained based on a result of the measurement by the etalon spectrometer, calculate a first spectral line width of the laser beam based on the obtained area of the first ratio, and calibrate the first spectral line width based on a correlation function representing correlation between the first spectral line width and a second spectral line width of the laser beam measured by a reference meter.

BRIEF DESCRIPTION OF THE DRAWINGS

Embodiments of the present disclosure will be described below as examples with reference to the accompanying drawings.

FIG. 10 is a flowchart following FIG. 9.

DESCRIPTION OF EMBODIMENTS

Contents

<1. Comparative example> (FIGS. 1 to 8)
1.1 Configuration
1.2 Operation
1.3 Problem
<2. Embodiment 1> (exemplary spectrum-line-width calculation using calibration function) (FIGS. 9 to 15)
2.1 Configuration
2.2 Operation
2.3 Effect
<3. Embodiment 2> (example in which calibration function is updated) (FIGS. 16 and 17)
3.1 Configuration
3.2 Operation
3.3 Effect
<4. Embodiment 3> (electronic-device manufacturing method) (FIG. 18)
<5. Other>

Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure.

Components identical to each other are denoted by an identical reference sign, and duplicate description thereof will be omitted.

1. Comparative Example

[1.1 Configuration]

Figure 1:
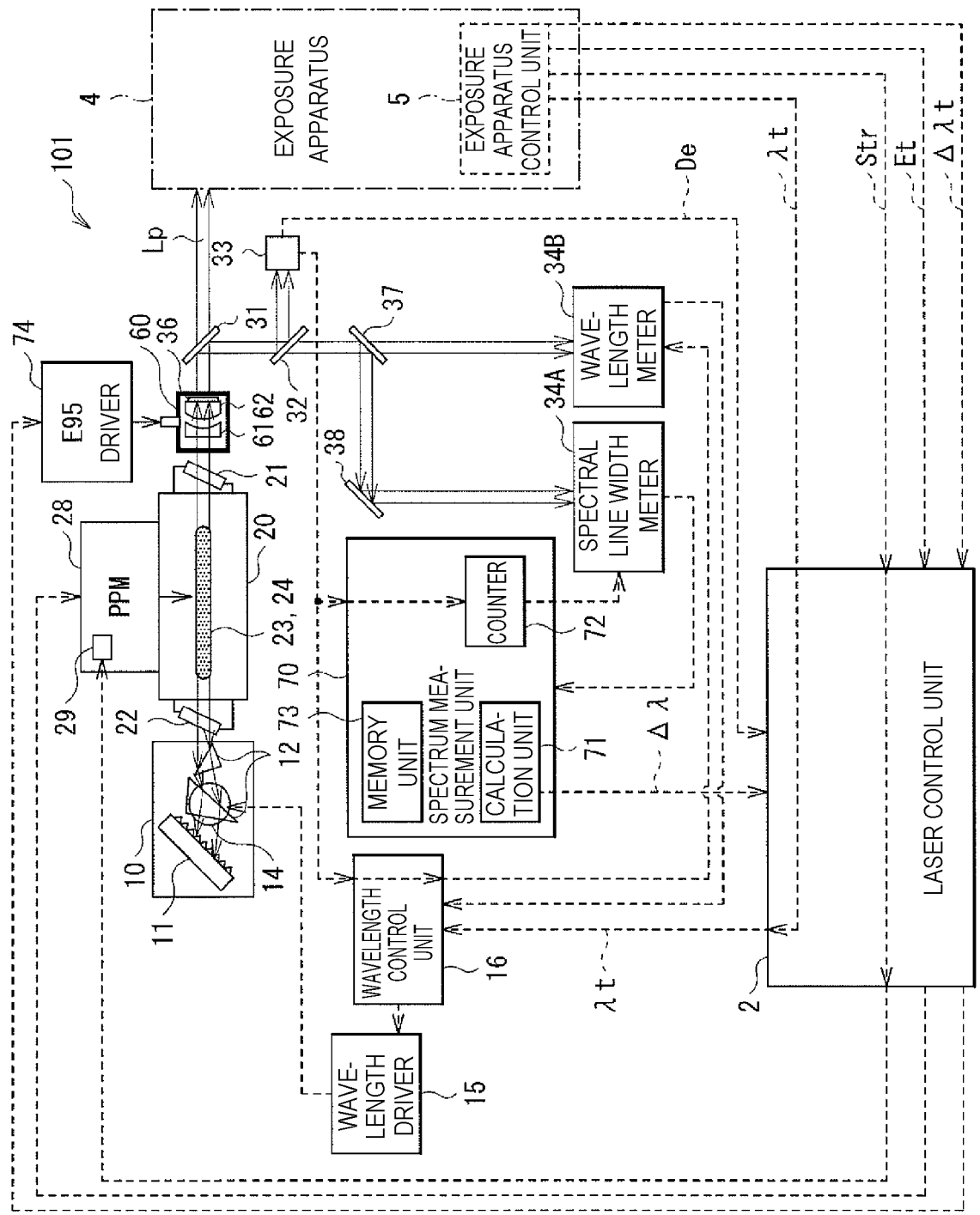
FIG. 1 schematically illustrates an exemplary configuration of a laser apparatus according to a comparative example.

FIG. 1 schematically illustrates an exemplary configuration of a laser apparatus 101 according to a comparative example.

The laser apparatus 101 according to the comparative example is an excimer laser apparatus configured to output a pulse laser beam Lp as a laser beam toward an exposure apparatus 4.

The laser apparatus 101 according to the comparative example includes a laser control unit 2, a line narrow module (LNM) 10, a laser chamber 20, a wavelength control unit 16, a wavelength driver 15, and a pulse power module (PPM) 28. The laser apparatus 101 also includes beam splitters 31 and 32, a pulse energy meter 33, a wavelength meter 34B, a spectral line width meter 34A, a beam splitter 37, a high reflectance mirror 38, an E95 change unit 60, and an E95 driver 74.

The E95 change unit 60 and the line narrow module 10 form a laser resonator. The laser chamber 20 is disposed on the optical path of the laser resonator.

The exposure apparatus 4 includes an exposure apparatus control unit 5. A signal line through which various pieces of target data and a light emission trigger signal Str are transmitted from the exposure apparatus control unit 5 to the laser control unit 2 is provided between the exposure apparatus 4 and the laser control unit 2. The various pieces of target data include a target pulse energy Et, a target wavelength λt, and a target spectral line width Δλt.

The laser chamber 20 includes windows 21 and 22 and a pair of discharge electrodes 23 and 24. The laser chamber 20 also includes an electric insulation member (not illustrated). The discharge electrodes 23 and 24 face each other in a direction orthogonal to the sheet of FIG. 1 in the laser chamber 20. The discharge electrodes 23 and 24 are disposed so that the longitudinal direction thereof is aligned with the optical path of the laser resonator.

The windows 21 and 22 are disposed so that a laser beam amplified between the discharge electrodes 23 and 24 passes through the windows 21 and 22. For example, Ar gas, $F_2$ gas, Xe gas, and Ne gas are supplied into the laser chamber 20 as laser gas. Alternatively, for example, Kr gas, $F_2$ gas, and Ne gas are supplied. The laser gas may further include He.

The pulse power module 28 includes a switch 29. The pulse power module 28 is a power source for applying high voltage between the discharge electrodes 23 and 24. The discharge electrode 23 as one of the discharge electrodes 23 and 24 is connected with the switch 29 so that high voltage is applied between the discharge electrodes 23 and 24 when the switch 29 is turned on. The discharge electrode 24 as the other of the discharge electrodes 23 and 24 is connected with the laser chamber 20 that is grounded.

The line narrow module 10 includes a grating 11, a prism 12, and a rotation stage 14 configured to rotate the prism 12. The prism 12 includes a plurality of prisms, for example, two prisms.

The prism 12 is disposed so that a laser beam output from the laser chamber 20 is subjected to beam expansion through the prism 12 and incident on the grating 11 at a predetermined angle.

The rotation stage 14 is disposed so that the beam incident angle at the grating 11 is changed as the prism 12 is rotated. The grating 11 is disposed in Littrow arrangement so that the beam incident and diffracting angles are equal to each other.

The beam splitter 31 is disposed on the optical path of the pulse laser beam Lp output from the E95 change unit 60. The beam splitter 32 is disposed on the optical path of the pulse laser beam Lp reflected by the beam splitter 31. The beam splitter 32 is disposed so that reflected light is incident on the pulse energy meter 33 and transmitted light is incident on the beam splitter 37.

The pulse energy meter 33 includes a light condensing lens and an optical sensor (not illustrated). The optical sensor may be a fast photodiode that is resistant against ultraviolet light. Data De of pulse energy E measured by the pulse energy meter 33 is transmitted to the laser control unit 2, the wavelength control unit 16, and a spectrum measurement unit 70. The laser control unit 2 controls voltage applied between the discharge electrodes 23 and 24 in the laser chamber 20 based on the data De of the pulse energy E.

The spectral line width meter 34A and the wavelength meter 34B may be, for example, etalon spectrometers as described later.

A signal line through which data of the target wavelength λt for performing wavelength control is transmitted from the laser control unit 2 to the wavelength control unit 16 is provided between the laser control unit 2 and the wavelength control unit 16.

The wavelength meter 34B measures a wavelength λ according to the principle of an etalon spectrometer to be described later.

A signal line through which a stage angle control signal for controlling a rotation stage angle θ of the rotation stage 14 is transmitted from the wavelength driver 15 to the rotation stage 14 is provided between the wavelength driver 15 and the rotation stage 14 of the line narrow module 10. The rotation stage angle θ of the rotation stage 14 is controlled by the wavelength control unit 16 through the wavelength driver 15 so that the wavelength λ of a laser beam output from the E95 change unit 60 is equal to the target wavelength λt. The wavelength control unit 16 controls the rotation stage angle θ based on the wavelength λ detected by the wavelength meter 34B and the target wavelength λt.

The spectral line width meter 34A measures, according to the principle of an etalon spectrometer to be described later, a fringe waveform for calculating a spectral line width Δλ at the spectrum measurement unit 70.

The spectrum measurement unit 70 includes a calculation unit 71, a counter 72, and a memory unit 73. The memory unit 73 stores various kinds of data related to calculation of the spectral line width Δλ. The calculation unit 71 calculates the spectral line width Δλ based on a result of measurement by the spectral line width meter 34A. The counter 72 counts the light emission trigger signal Str. Alternatively, the counter 72 may perform the counting of the light emission trigger signal Str by counting the data De of the pulse energy E measured by the pulse energy meter 33.

A signal line through which data of the spectral line width Δλ calculated by the spectrum measurement unit 70 is transmitted from the spectrum measurement unit 70 to the laser control unit 2 is provided between the laser control unit 2 and the spectrum measurement unit 70.

The E95 change unit 60 includes a lens 61 that is, for example, a cylindrical concave lens, and a lens 62 that is, for example, a cylindrical convex lens. The E95 change unit 60 also includes a linear stage (not illustrated) configured to adjust the interval between the lenses 61 and 62, and an actuator configured to adjust the position of the linear stage.

The E95 change unit 60 can adjust the spectral line width Δλ of a laser beam by adjusting the interval between the lenses 61 and 62. One surface of the lens 62 is a plane surface coated with a partial reflection film (PR film) 36 that partially reflects and partially transmits a laser beam. Coated with the partial reflection film 36, the lens 62 also functions as an output coupling mirror that serves as an output coupler (OC). Alternatively, the lens 62 may not be coated with the partial reflection film 36 and the output coupling mirror may be separately disposed.

The interval between the lenses 61 and 62 in the E95 change unit 60 is controlled by the laser control unit 2 through the E95 driver 74 so that the spectral line width Δλ of a laser beam output from the E95 change unit 60 is equal to the target spectral line width Δλt. The laser control unit 2 controls the interval between the lenses 61 and 62 through the E95 driver 74 based on the target spectral line width Δλt and the spectral line width Δλ calculated based on a result of measurement by the spectral line width meter 34A.

(Spectral Line Width)

Figure 2:
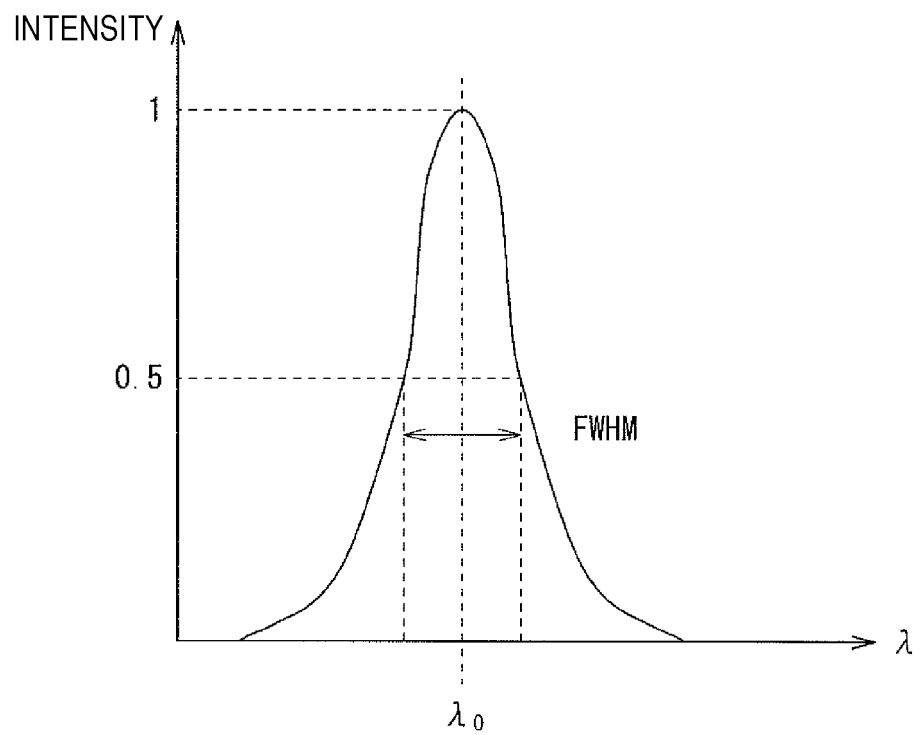
FIG. 2 illustrates an overview of FWHM as an exemplary spectral line width.
Figure 3:
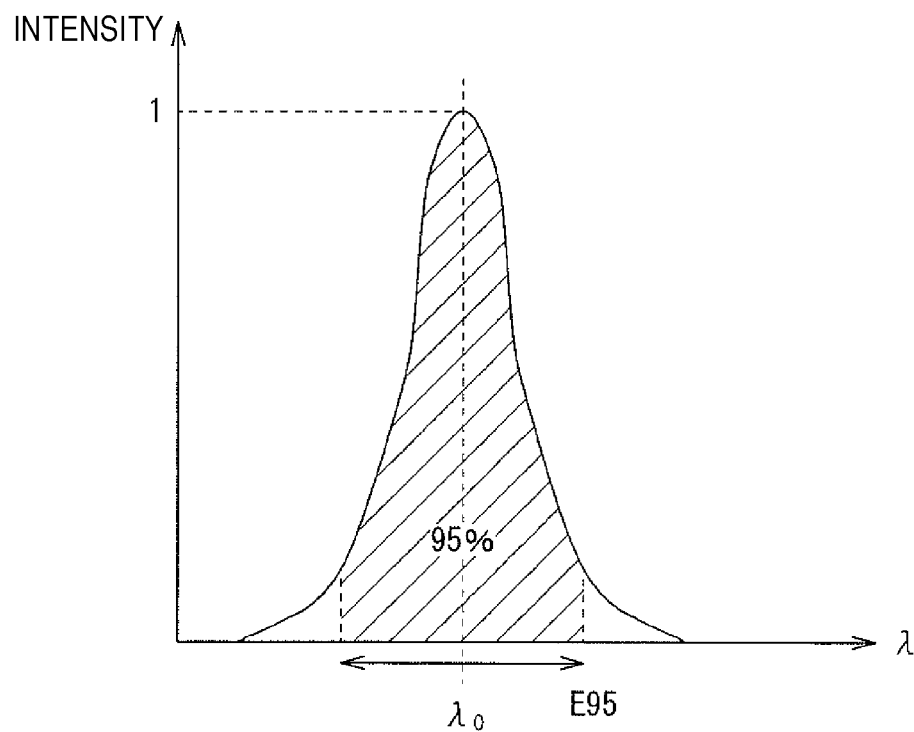
FIG. 3 illustrates an overview of E95 as an exemplary spectral line width.

FIG. 2 illustrates an overview of FWHM as an exemplary spectral line width Δλ. FIG. 3 illustrates an overview of E95 as another example spectral line width Δλ. In FIGS. 2 and 3, the horizontal axis represents the wavelength λ, and the vertical axis represents light intensity.

The spectral line width Δλ is the full width of the spectral waveform of a laser beam at a light intensity threshold. In the present specification, the value of each light intensity threshold relative to a light intensity peak value is referred to as a line width threshold Thresh (0<Thresh<1).

As illustrated in FIG. 2, for example, the half value of the light intensity peak value is referred to as a line width threshold 0.5. In particular, the full width of the spectral waveform at the line width threshold 0.5 is referred to as full width at half maximum (FWHM).

In the present specification, as illustrated in FIG. 3, the full width of the spectral waveform of a part centered at a wavelength $\lambda_0$ and occupying 95% of the whole spectrum energy is referred to as spectral purity. In the present specification, the spectral line width Δλ as the spectral purity is referred to as E95. For the spectral purity, Expression (1) below holds when $g(\lambda)$ represents the spectral waveform.

[Expression 1]

$$\frac{\int_{-\frac{\Delta\lambda}{2}}^{\frac{\Delta\lambda}{2}} g(\lambda + \lambda_0) d\lambda}{\int_{-\infty}^{\infty} g(\lambda + \lambda_0) d\lambda} = 0.95 \qquad (1)$$

(Specific Examples of Spectral Line Width Meter 34A and Wavelength Meter 34B)

Part of the pulse laser beam Lp output from the lens 62 functioning as an output coupling mirror in the E95 change unit 60 is incident on the pulse energy meter 33, as sample light for detecting the pulse energy E, through the beam splitter 31 and the beam splitter 32.

Light having transmitted through the beam splitter 32 is further separated into two directions through the beam splitter 37. Light having transmitted through the beam splitter 37 is incident on the wavelength meter 34B. Light reflected by the beam splitter 37 is reflected toward the spectral line width meter 34A by the high reflectance mirror 38.

Figure 4:
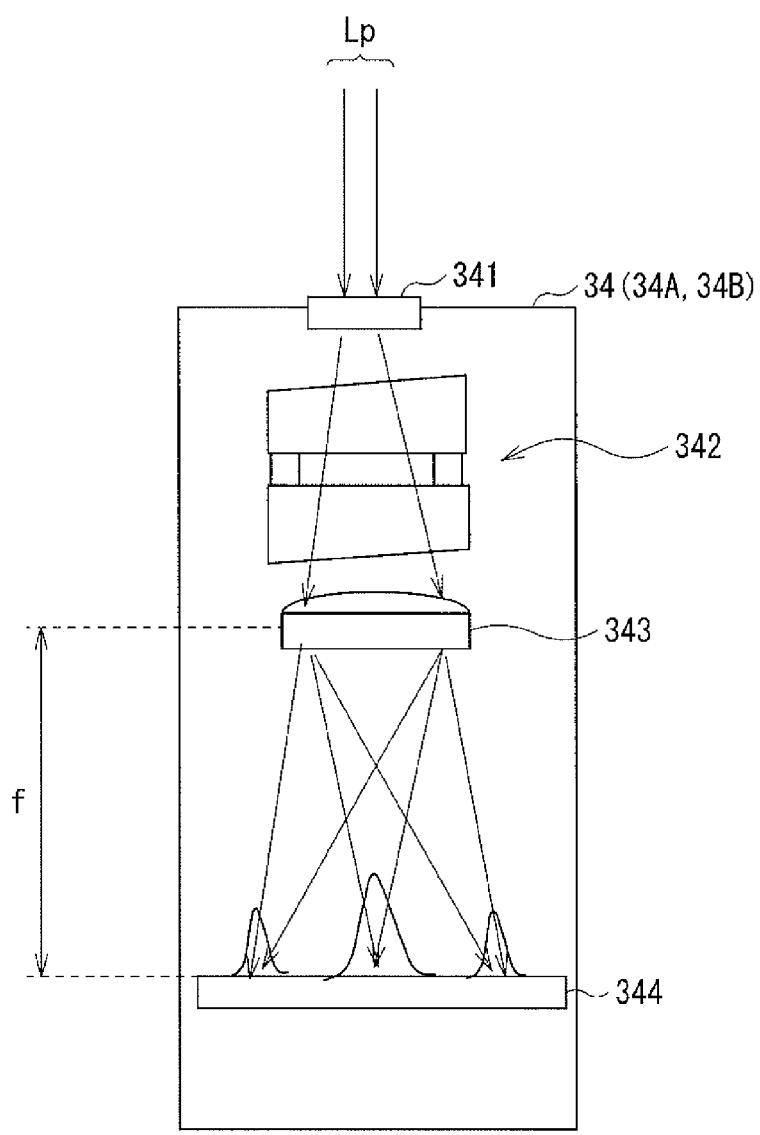
FIG. 4 schematically illustrates an exemplary configuration of a spectrum meter applied to the laser apparatus according to the comparative example.

The spectral line width meter 34A and the wavelength meter 34B are each configured by a spectrum meter 34 illustrated in, for example, FIG. 4.

FIG. 4 schematically illustrates an exemplary configuration when the spectrum meter 34 is an etalon spectrometer.

In the exemplary configuration illustrated in FIG. 4, the spectrum meter 34 includes a diffusion element 341, a monitor etalon 342, a light condensing lens 343, and an image sensor 344. The image sensor 344 may be a line sensor in which a plurality of photodiode arrays are one-dimensionally arrayed. The focal length of the light condensing lens 343 is denoted by $f$.

At the spectrum meter 34, the pulse laser beam Lp is first incident on the diffusion element 341. The diffusion element 341 scatters the incident light. The scattered light is incident on the monitor etalon 342. The light having transmitted through the monitor etalon 342 is incident on the light condensing lens 343 and generates an interference fringe on the focal point plane of the light condensing lens 343.

The image sensor 344 is disposed on the focal point plane of the light condensing lens 343. The image sensor 344 detects the interference fringe on the focal point plane. The square of the radius r of the interference fringe is proportional to the wavelength λ of the pulse laser beam Lp. Thus, the spectral line width Δλ and the central wavelength as spectrum profiles of the pulse laser beam Lp can be detected from the detected interference fringe.

A result of measurement by the spectral line width meter 34A as an exemplary spectrum meter 34 is transmitted to the spectrum measurement unit 70. The spectrum measurement unit 70 calculates the spectral line width Δλ based on the fringe waveform measured by the spectral line width meter 34A.

In addition, a result of measurement by the wavelength meter 34B as another exemplary spectrum meter 34 is transmitted to the wavelength control unit 16. The wavelength control unit 16 calculates the wavelength λ based on the fringe waveform measured by the wavelength meter 34B.

The relation between the radius r of the interference fringe and the wavelength λ can be approximated by Expression (A) below.

$$\lambda = \lambda c + \alpha r^2 \quad (A)$$

where

α: proportional constant, r: interference fringe radius, and

λc: wavelength when the light intensity at the center of the interference fringe is maximum.

Figure 5:
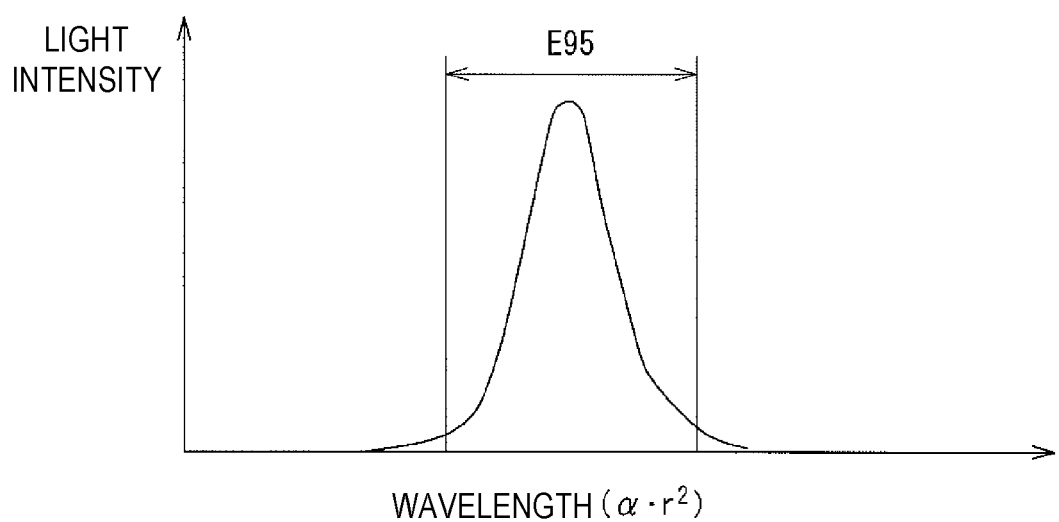
FIG. 5 schematically illustrates an exemplary spectral line width measured by the spectrum meter illustrated in FIG. 4.

FIG. 5 schematically illustrates an exemplary spectral line width Δλ measured by the spectrum meter 34 illustrated in FIG. 4.

From the above-described Expression (1), the interference fringe may be converted into the spectral waveform representing the relation between the light intensity and the wavelength λ, and then E95 may be calculated as the spectral line width Δλ. Alternatively, the spectral line width Δλ may be set to be the full width at half maximum of the spectral waveform.

[1.2 Operation]

The laser control unit 2 reads various pieces of target data from the exposure apparatus 4. The various pieces of target data include the target pulse energy Et, the target wavelength λt, and the target spectral line width Δλt.

The laser control unit 2 transmits an "on" signal to the switch 29 of the pulse power module 28 in synchronization with the light emission trigger signal Str transmitted from the exposure apparatus 4. Accordingly, high voltage is applied between the discharge electrodes 23 and 24 in the laser chamber 20, and insulation breakdown occurs to the laser gas in an electrical discharging region between the discharge electrodes 23 and 24, thereby causing electrical discharging. As a result, the laser gas is excited in the laser chamber 20, and laser oscillation occurs between the line narrow module 10 and the output coupling mirror formed at the lens 62 of the E95 change unit 60 of the laser resonator. The pulse laser beam Lp generated through the laser oscillation and having a narrowed spectral width is output from the output coupling mirror.

Part of the pulse laser beam Lp output from the output coupling mirror is incident on the pulse energy meter 33 as sample light for detecting the pulse energy E through the beam splitter 31 and the beam splitter 32. The pulse energy meter 33 detects the pulse energy E of the pulse laser beam Lp output from the output coupling mirror. The pulse energy meter 33 transmits the data De of the detected pulse energy E to the laser control unit 2.

Light having transmitted through the beam splitter 32 is further separated into two directions through the beam splitter 37. Light having transmitted through the beam splitter 37 is incident on the wavelength meter 34B, and the wavelength λ thereof is detected by the wavelength meter 34B. Light reflected by the beam splitter 37 is reflected toward the spectral line width meter 34A by the high reflectance mirror 38, and the fringe waveform for calculating the spectral line width Δλ is detected by the spectral line width meter 34A.

The laser control unit 2 transmits data of the target wavelength λt to the wavelength control unit 16. The wavelength control unit 16 controls the angle of the prism 12 of the line narrow module 10 by controlling the rotation angle of the rotation stage 14 through the wavelength driver 15 based on the wavelength λ measured by the wavelength meter 34B so that the target wavelength λt is achieved.

The spectrum measurement unit 70 calculates the spectral line width Δλ based on the fringe waveform measured by the spectral line width meter 34A, and transmits data of the calculated spectral line width Δλ to the laser control unit 2.

the laser control unit 2 controls the interval between the lenses 61 and 62 of the E95 change unit 60 through the E95 driver 74 based on the spectral line width Δλ calculated by the spectrum measurement unit 70 so that the target spectral line width Δλt is achieved. As a result, the spectral line width Δλ of the pulse laser beam Lp output from the output coupling mirror formed at the lens 62 can become closer to the target spectral line width Δλt.

(Spectrum-line-width Measurement)

The spectrum measurement unit 70 measures the spectral line width Δλ as described below.

The spectrum measurement unit 70 integrates the spectral waveforms of a plurality of pulses, which are measured by the spectral line width meter 34A, over an integration number Ni. The integration number Ni is the number of times of emission of the pulses for integration. The spectrum measurement unit 70 calculates the spectral line width Δλ based on an integration waveform Oi obtained through the integration.

Specifically, the spectrum measurement unit 70 averages each of the Na integration waveforms Oi. The number Na is the number of times of averaging the integration waveforms Oi. The combination (Ni, Na) of Ni and Na may include, for example, 8 for Ni and 5 for Na ((Ni, Na)=(8, 5)). Alternatively, the combination (Ni, Na) of Ni and Na may include, for example, 5 for Ni and 8 for Na ((Ni, Na)=(5, 8)).

Figure 7:
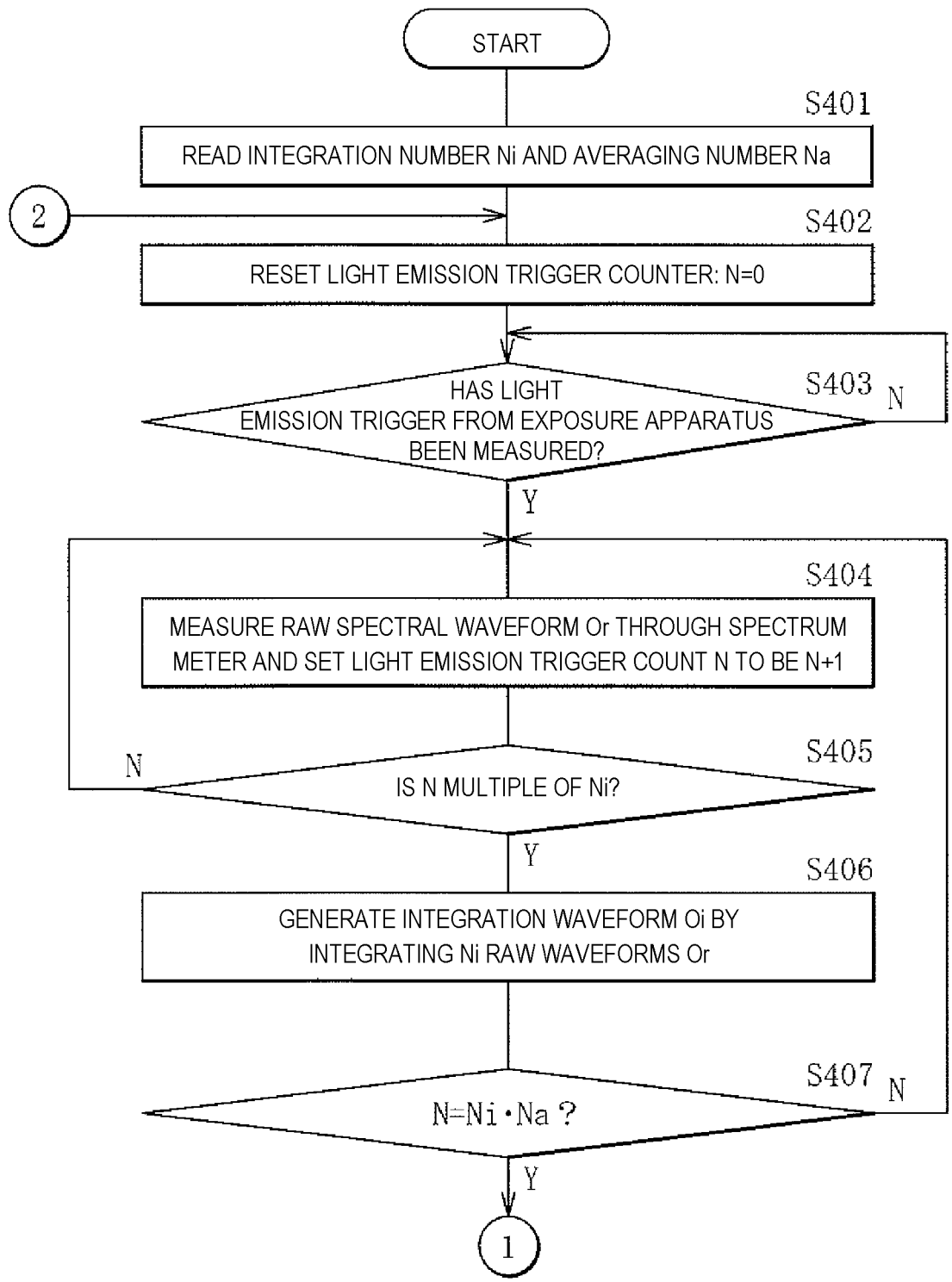
FIG. 7 is a flowchart illustrating an exemplary process of a spectrum-line-width measurement operation at the laser apparatus according to the comparative example.
Figure 8:
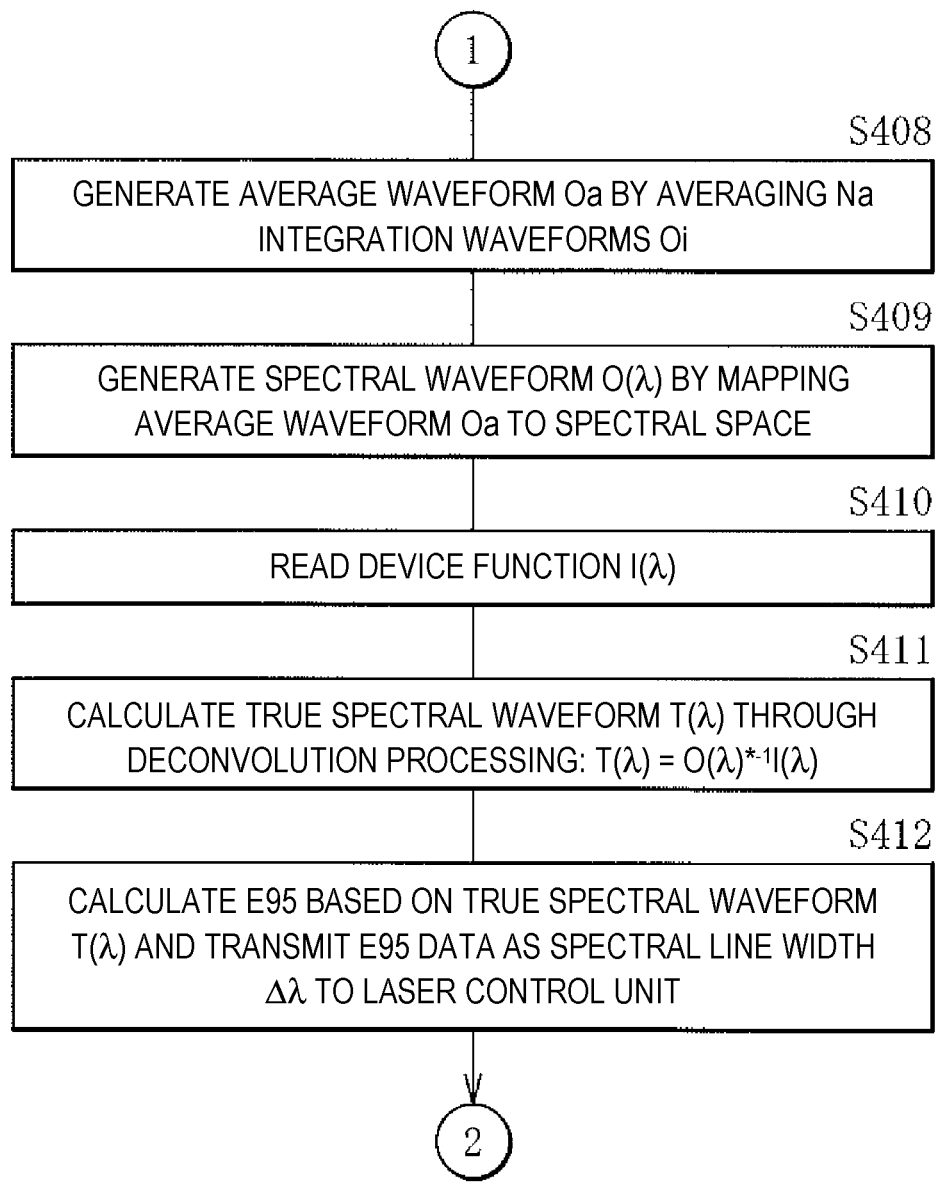
FIG. 8 is a flowchart following FIG. 7.

FIGS. 7 and 8 are each a flowchart illustrating an exemplary process of the measurement operation of the spectral line width Δλ by the spectrum measurement unit 70 in the laser apparatus 101 according to the comparative example.

First, the spectrum measurement unit 70 reads data of the integration number Ni and the averaging number Na from the memory unit 73 (step S401).

Subsequently, the spectrum measurement unit 70 resets a counter value N of the counter 72 as a light emission trigger counter to be zero (step S402). The light emission trigger counter counts the light emission trigger signal Str.

Subsequently, the spectrum measurement unit 70 determines whether the light emission trigger signal Str from the exposure apparatus 4 has been measured (step S403). When having determined that the light emission trigger signal Str has not been measured (N at step S403), the spectrum measurement unit 70 repeats the processing at step S403.

When having determined that the light emission trigger signal Str has been measured (Y at step S403), the spectrum measurement unit 70 subsequently measures a raw spectral waveform Or through the spectral line width meter 34A (step S404). The raw spectral waveform Or is the fringe waveform measured by the spectral line width meter 34A. Then, the spectrum measurement unit 70 sets the counter value N of the light emission trigger counter to be N+1.

Subsequently, the spectrum measurement unit 70 determines whether the counter value N of the light emission trigger counter is an integer multiple of Ni (step S405). When having determined that the counter value N is not an integer multiple of Ni (N at step S405), the spectrum measurement unit 70 returns to the processing at step S404.

When having determined that the counter value N is an integer multiple of Ni (Y at step S405), the spectrum measurement unit 70 subsequently generates the integration waveform Oi by integrating the Ni raw waveforms Or (step S406).

Subsequently, the spectrum measurement unit 70 determines whether the counter value N of the light emission trigger counter is equal to the product (Ni·Na) of Ni and Na (N=Ni·Na) (step S407). When having determined that N=Ni·Na does not hold (N at step S407), the spectrum measurement unit 70 returns to the processing at step S404.

When having determined that N=Ni·Na holds (Y at step S407), the spectrum measurement unit 70 subsequently generates an average waveform Oa by averaging the Na integration waveforms Oi (step S408 in FIG. 8).

Subsequently, the spectrum measurement unit 70 generates a spectral waveform O(λ) by mapping the average waveform Oa to the spectral space (step S409).

The spectral waveform O(λ) generated as described above is deformed under influence of a device function I(λ) of the spectral line width meter 34A. Thus, the spectral line width Δλ directly obtained from the spectral waveform O(λ) is different from the spectral line width Δλ obtained from a true spectral waveform T(λ) of the laser beam. To perform accurate spectral line width control, the true spectral waveform T(λ) of the laser beam needs to be obtained.

When the spectral waveform O(λ) is the result of convolution integration of the true spectral waveform T(λ) with the device function I(λ), the true spectral waveform T(λ) is obtained through deconvolution processing of the spectral waveform O(λ) with the device function I(λ) in theory. The deconvolution processing is performed by iterative processing such as Fourier transform, the Jacobi method, or the Gauss-Seidel method.

Figure 6:
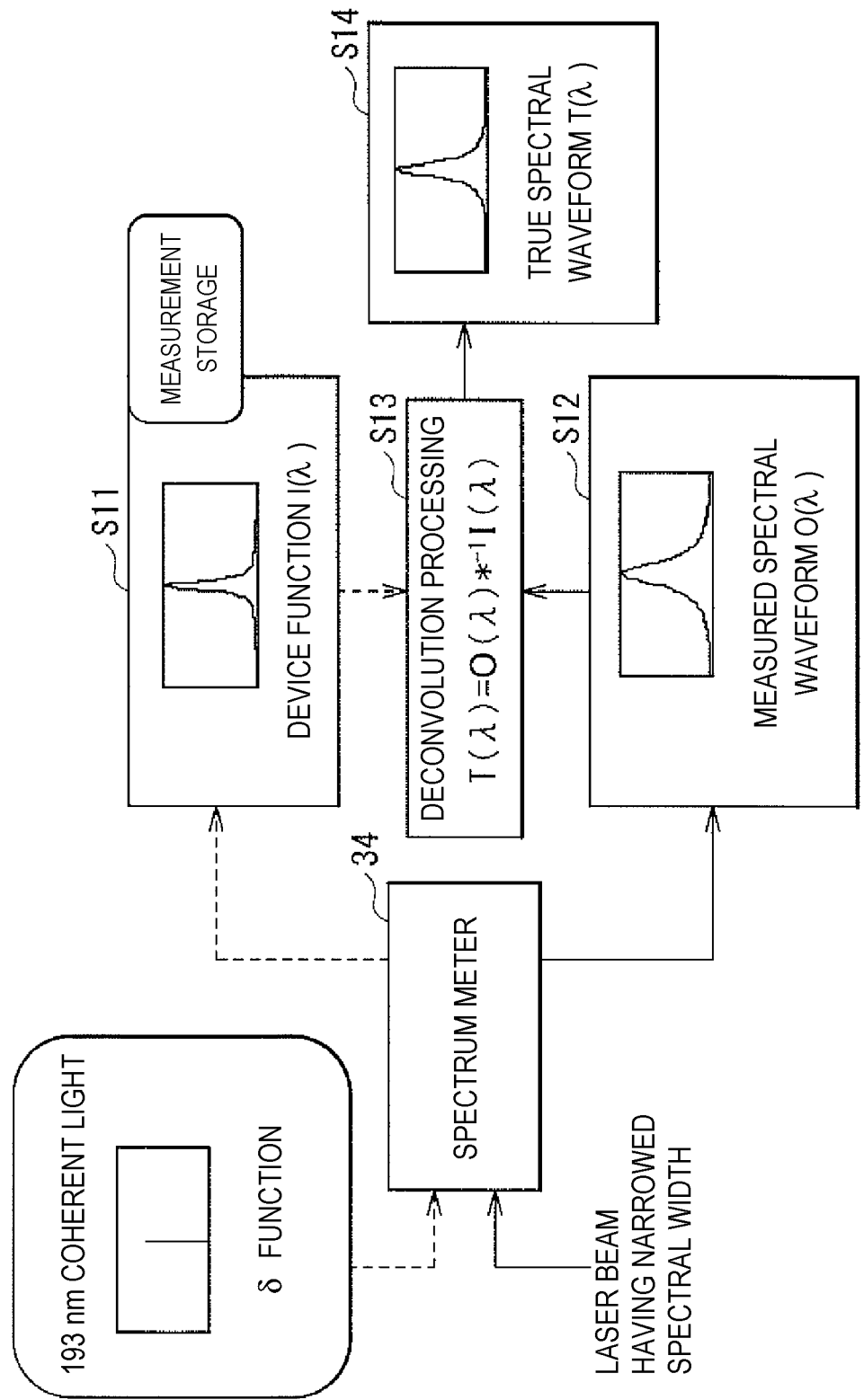
FIG. 6 schematically illustrates an exemplary method of calculating a true spectral waveform based on a result of measurement by the spectrum meter illustrated in FIG. 4.

FIG. 6 schematically illustrates an exemplary method of calculating the true spectral waveform based on a result of measurement by the spectrum meter 34 as the spectral line width meter 34A illustrated in FIG. 4.

First, for example, the spectral waveform of coherent light of 193 nm is measured by the spectrum meter 34 and stored in the memory unit 73 in advance (step S11). A coherent light source provides a sufficiently narrow spectral line width Δλ, and thus the spectral waveform can be regarded as a δ (delta) function. Accordingly, the measured spectral waveform can be regarded as the actual value of the device function I(λ) of the spectrum meter 34.

The spectral waveform O(λ) of the laser beam having a narrowed spectral width is obtained based on a result of measurement by the spectrum meter 34 as described above (step S12). The true spectral waveform T(λ) can be obtained by performing the deconvolution processing of the spectral waveform O(λ) by using the device function I(λ) (step S13).

Thus, after having generated the spectral waveform O(λ) at step S409, the spectrum measurement unit 70 reads data of the device function I(λ) of the spectral line width meter 34A from the memory unit 73 (step S410). Subsequently, the spectrum measurement unit 70 calculates the true spectral waveform T(λ) through the deconvolution processing as in an expression below (step S411). The symbol * represents the convolution integration, and the symbol $*^{-1}$ represents the deconvolution processing.

$$T(\lambda)=O(\lambda)*^{-1}I(\lambda)$$

The deconvolution processing is arithmetic processing described below.

The convolution integration h=ƒ*g of a function ƒ and a function g is expressed by Expression (2) below. Arithmetic processing of estimating the function ƒ that satisfies the relation of Expression (2) is the deconvolution processing of the function h and the function g and expressed as $ƒ=h*^{-1}g$.

[Expression 2]

$$h(t)=\int_{-\infty}^{\infty}f(\tau)\cdot g(t-\tau)d\tau \qquad (2)$$

Subsequently, the spectrum measurement unit 70 calculates E95 from the true spectral waveform T(λ) and transmits data of E95 as the spectral line width Δλ to the laser control unit 2 (step S412). Thereafter, the spectrum measurement unit 70 returns to the processing at step S402.

[1.3 Problem]

As described above, to measure the spectral line width Δλ in the laser apparatus 101 according to the comparative example, the spectrum measurement unit 70 calculates the integration waveform Oi by integrating the Ni raw spectral waveforms Or measured by the spectral line width meter 34A, and generates the average waveform Oa by averaging the Na integration waveforms Oi. The spectrum measurement unit 70 generates the spectral waveform O(λ) by mapping the average waveform Oa to the spectral space. Thereafter, the spectrum measurement unit 70 calculates the true spectral waveform T(λ) by performing the deconvolution processing of the spectral waveform O(λ) and the device function I(λ). The spectrum measurement unit 70 calculates E95 as the spectral line width Δλ based on the true spectral waveform T(λ).

In this manner, since the deconvolution processing is performed to calculate the spectral line width Δλ in the laser apparatus 101 according to the comparative example, the processing takes time, and thus it is difficult to increase the speed of measurement of the spectral line width Δλ and the speed of control of the spectral line width Δλ. As a result, it is difficult to improve the stability of the spectral line width Δλ.

2. Embodiment 1 (Exemplary Spectrum-line-width Calculation Using Calibration Function)

The following describes a laser apparatus according to Embodiment 1 of the present disclosure. In the following description, a component substantially same as that of the laser apparatus 101 according to the comparative example described above is denoted by the same reference sign, and description thereof is omitted as appropriate.

[2.1 Configuration]

The basic configuration of the laser apparatus according to Embodiment 1 is substantially same as that of the laser apparatus 101 according to the comparative example described above. However, the calculation operation of the spectral line width Δλ by the spectrum measurement unit 70 is partially different as described below.

In the laser apparatus according to Embodiment 1, the spectrum measurement unit 70 obtains the area of a first ratio in the spectral space obtained based on a result of measurement by the spectral line width meter 34A, and calculates a first spectral line width of a laser beam based on the obtained area of the first ratio. The first ratio is 95% when E95 is calculated as the spectral line width Δλ. The first spectral line width is a spectral line width E95raw to be described later.

The spectrum measurement unit 70 calibrates the first spectral line width based on a calibration function F(x). The spectrum measurement unit 70 transmits the spectral line width Δλ obtained through the calibration based on the calibration function F(x) to the laser control unit 2. The spectral line width Δλ obtained through the calibration based on the calibration function F(x) is a spectral line width E95calib to be described later.

Figure 15:
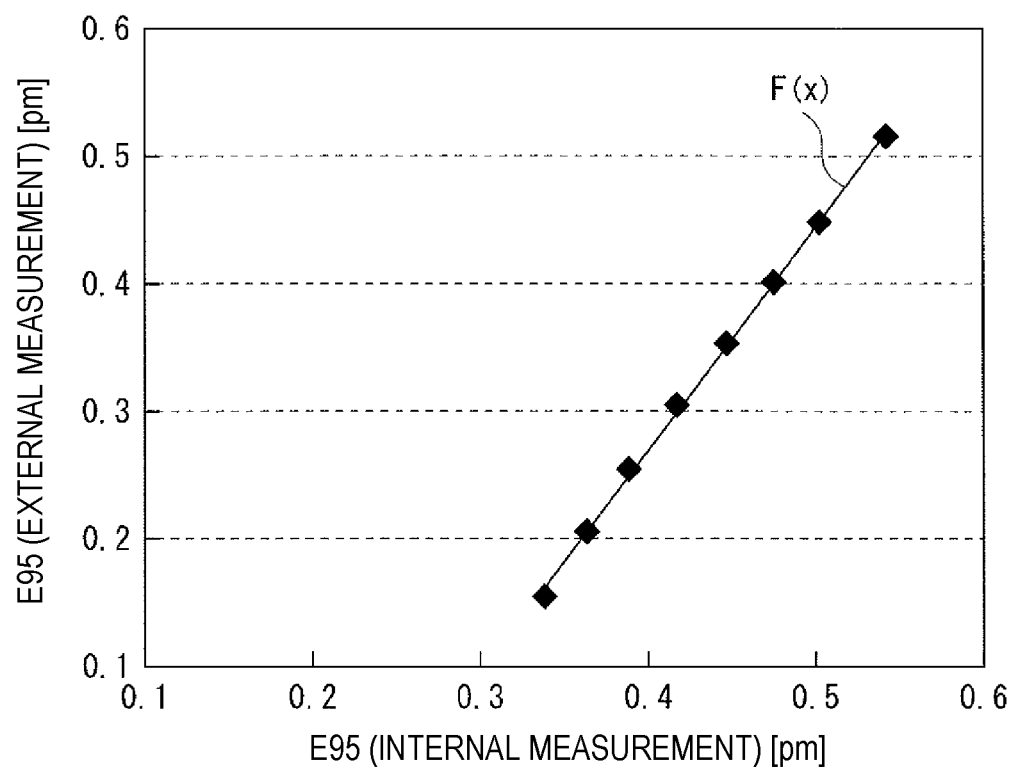
FIG. 15 schematically illustrates an exemplary calibration function used in spectrum-line-width calculation.

The memory unit 73 of the spectrum measurement unit 70 stores in advance, for example, the calibration function F(x) as illustrated in FIG. 15 to be described later. The calibration function F(x) is a correlation function representing the correlation between the first spectral line width and a second spectral line width of the laser beam, which is measured by a reference meter in advance. An external spectrum meter is used as the reference meter. The external spectrum meter may be a spectrometer including an etalon as illustrated in FIG. 4 or may be a spectrometer including a diffraction grating.

[2.2 Operation]

Figure 9:
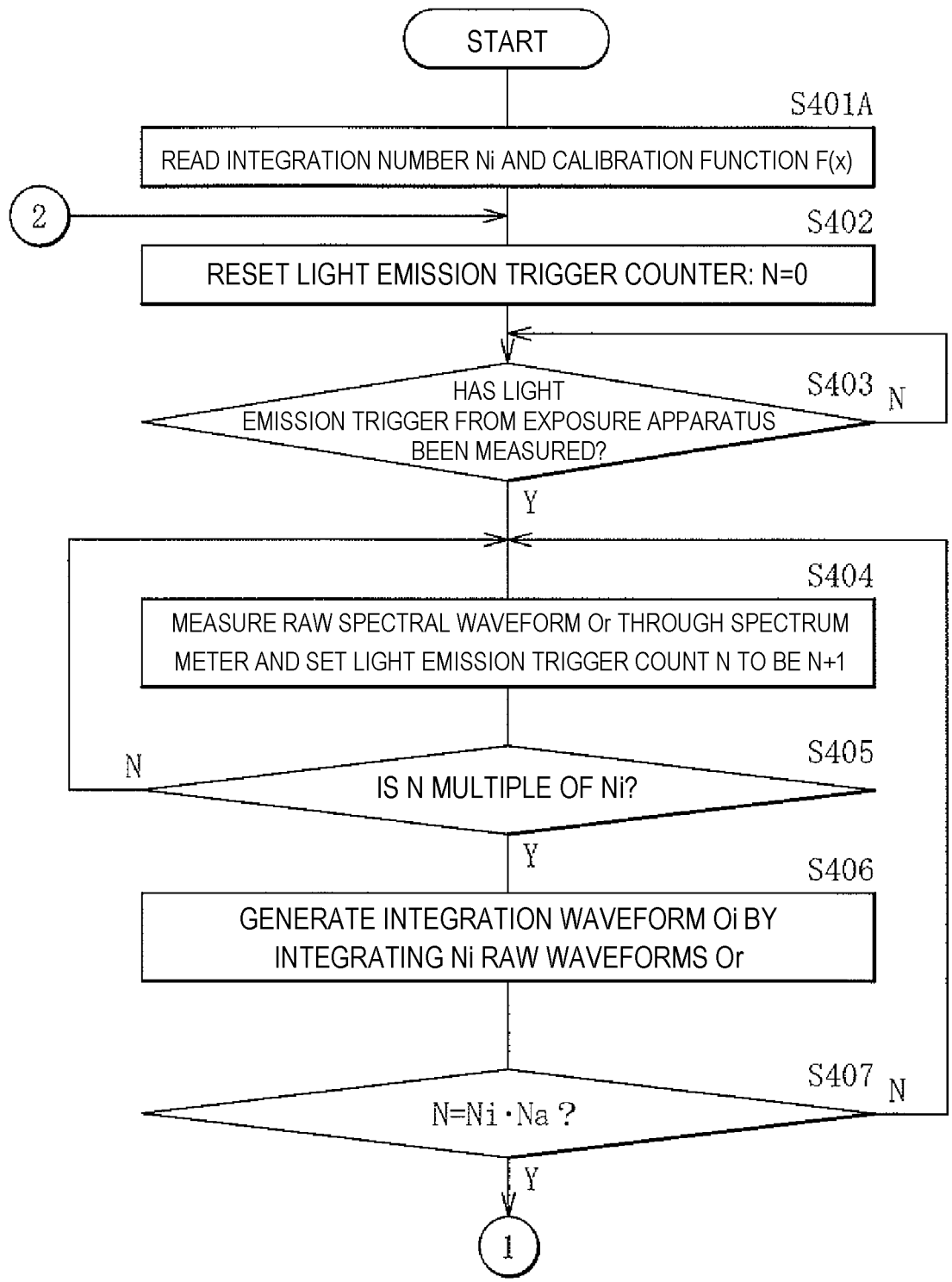
FIG. 9 is a flowchart illustrating an exemplary process of the spectrum-line-width measurement operation at the laser apparatus according to Embodiment 1.

FIGS. 9 and 10 are each a flowchart illustrating an exemplary process of the measurement operation of the spectral line width Δλ in the laser apparatus according to Embodiment 1. The laser apparatus according to Embodiment 1 performs the measurement operation illustrated in FIGS. 9 and 10 in place of the measurement operation of the spectral line width Δλ illustrated in FIGS. 7 and 8. In FIGS. 9 and 10, a step of performing processing same as that at the corresponding step in the flowchart of FIGS. 7 and 8 is denoted by the same step number.

First, the spectrum measurement unit 70 reads data of the integration number Ni and the calibration function F(x) from the memory unit 73 (step S401A).

Thereafter, the spectrum measurement unit 70 performs processing same as that at steps S402 to S407 in FIG. 7 to generate the integration waveform Oi by integrating the Ni raw waveforms Or. The integration processing does not need to be performed when the integration number Ni is one.

Figure 12:
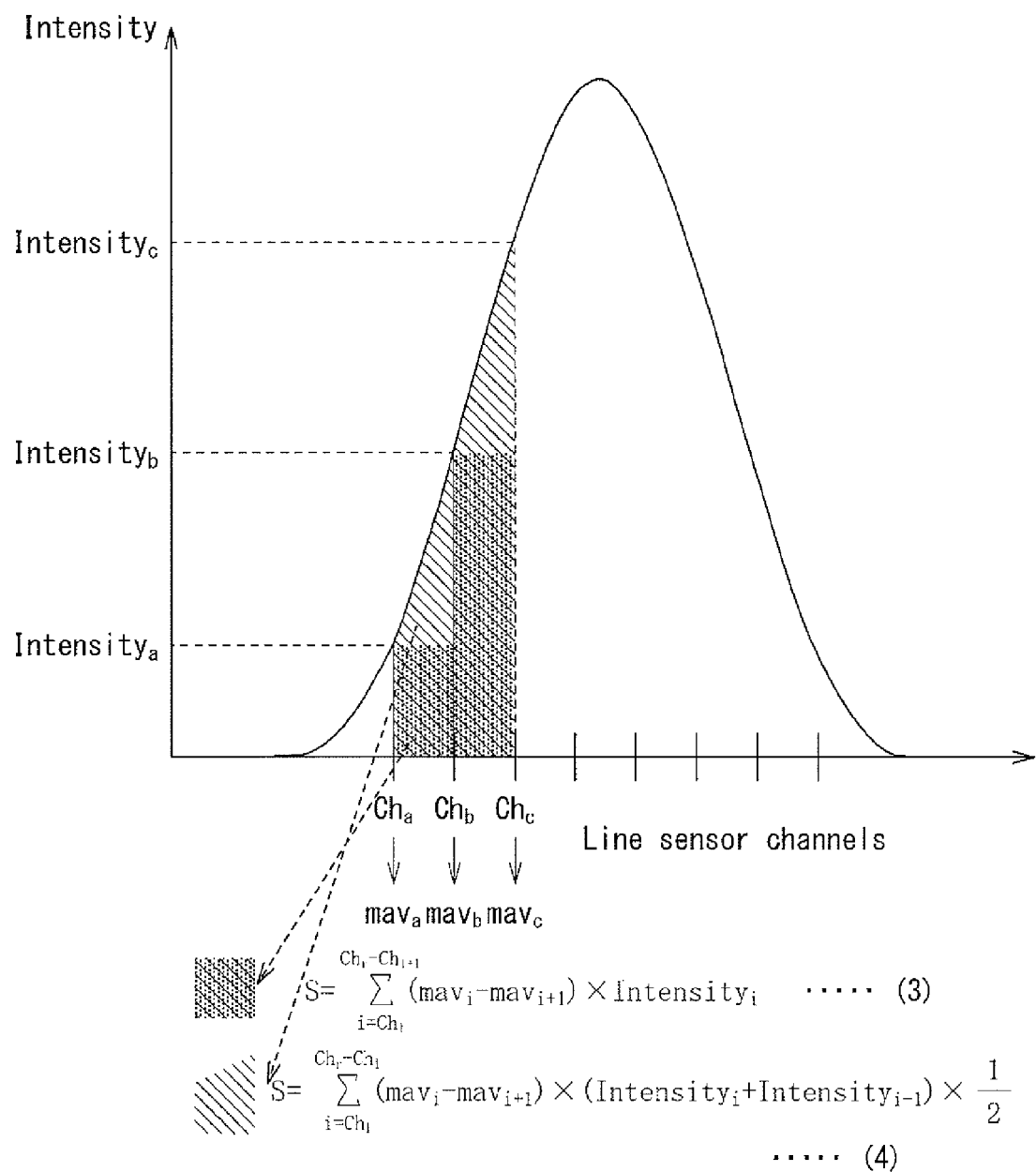
FIG. 12 schematically illustrates an exemplary spectrum-space-area calculation method based on a fringe waveform at the laser apparatus according to Embodiment 1.

Subsequently, the area of the spectral space is obtained from the integration waveform Oi, and the spectral line width E95raw is calculated from the area of the spectral space (step S421 in FIG. 10). The area of the spectral space can be obtained as illustrated in FIG. 12 to be described later. The spectral line width E95raw is the first spectral line width described above.

Subsequently, the spectrum measurement unit 70 calculates the spectral line width E95calib from the spectral line width E95raw by using the calibration function F(x) (step S422).

Subsequently, the spectrum measurement unit 70 sets E95 to be the calculated spectral line width E95calib and transmits data of E95 as the spectral line width Δλ to the laser control unit 2 (step S423). Thereafter, the spectrum measurement unit 70 returns to the processing at step S402.

Figure 11A:
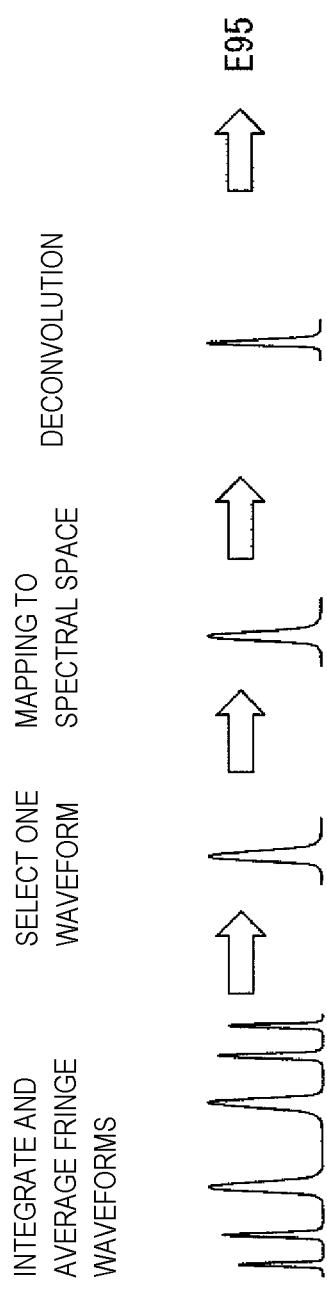
FIGS. 11A and 11B schematically illustrate comparison between a spectrum-line-width calculation method by the laser apparatus according to the comparative example and a spectrum-line-width calculation method according to Embodiment 1.
Figure 11B:
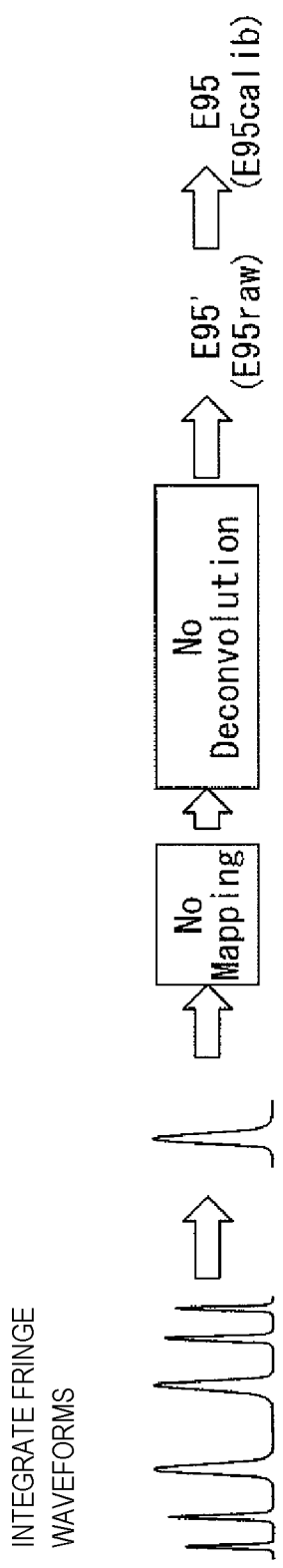

FIGS. 11A and 11B schematically illustrate comparison between the method of calculating the spectral line width Δλ by the laser apparatus 101 according to the comparative example illustrated in FIGS. 7 and 8 and the method of calculating the spectral line width Δλ by the laser apparatus according to according to Embodiment 1 illustrated in FIGS. 9 and 10.

FIG. 11A schematically illustrates the method of calculating the spectral line width Δλ by the laser apparatus 101 according to the comparative example.

In the laser apparatus 101 according to the comparative example, the spectrum measurement unit 70 generates each average waveform Oa by integrating and averaging the Ni fringe waveforms (raw waveforms Or) measured by the spectral line width meter 34A. Subsequently, the spectrum measurement unit 70 selects one of the average waveforms Oa and generates the spectral waveform O(λ) by mapping the selected average waveform Oa to the spectral space. Thereafter, the spectrum measurement unit 70 calculates the true spectral waveform T(λ) by performing the deconvolution processing of the spectral waveform O(λ) and the device function I(λ). The spectrum measurement unit 70 calculates E95 as the spectral line width Δλ based on the true spectral waveform T(λ).

FIG. 11B schematically illustrates the method of calculating the spectral line width Δλ by the laser apparatus according to according to Embodiment 1.

In the laser apparatus according to Embodiment 1, the spectrum measurement unit 70 generates each integration waveform Oi by integrating the Ni fringe waveforms (raw waveforms Or) measured by the spectral line width meter 34A. Subsequently, the spectrum measurement unit 70 calculates a spectral line width E95' (E95raw) based on one of the integration waveforms Oi. Subsequently, the spectrum measurement unit 70 calculates a spectral line width E95 (E95calib) by calibrating the spectral line width E95' by using the calibration function F(x).

In this manner, unlike the laser apparatus 101 according to the comparative example, the laser apparatus according to Embodiment 1 calculates the spectral line width E95 without performing the spectral-space mapping processing and the deconvolution processing based on the fringe waveform measured by the spectral line width meter 34A.

FIG. 12 schematically illustrates an exemplary spectrum-space-area calculation method based on the fringe waveform in the laser apparatus according to Embodiment 1.

The laser apparatus according to Embodiment 1 calculates entire area S of the spectral space by using Expressions (3) and (4) below as illustrated in FIG. 12 without mapping the fringe waveform measured by the spectral line width meter 34A to the spectral space.

[Expression 3]

$$S = \sum_{i=Ch_1}^{Ch_r - Ch_{1+1}} (mav_i - mav_{i+1}) \times Intensity_i \qquad (3)$$

[Expression 4]

$$S = \sum_{i=Ch_1}^{Ch_r - Ch_1} (mav_i - mav_{i+1}) \times (Intensity_i + Intensity_{i-1}) \times \frac{1}{2} \qquad (4)$$

The spectral line width meter 34A includes the image sensor 344 as illustrated in FIG. 4. The image sensor 344 includes a plurality of line sensors. The line sensors are arranged in the order of a channel (Ch; integer). The channel corresponds to the position of each line sensor in the image sensor 344. In FIG. 12, the horizontal axis represents the channel Ch of each line sensor in the image sensor 344. The vertical axis represents the intensity of the fringe waveform.

The spectrum measurement unit 70 calculates, by using Expressions (3) and (4), the entire area S of the spectral space by dividing the fringe waveform into a plurality of divided wavelength intervals ($mav_i$–$mav_{i+1}$), calculating the divided area of a rectangle and the divided area of a trapezoid in each divided wavelength interval, and integrating the divided areas. The divided wavelength interval ($mav_i$–$mav_{i+1}$) corresponds to the wavelength between two channels $Ch_i$ and $Ch_{i+1}$.

The spectrum measurement unit 70 calculates the spectral line width E95raw as a width corresponding to 95% of the entire area S from the entire area S of the spectral space, which is calculated by using Expressions (3) and (4).

Figure 13:
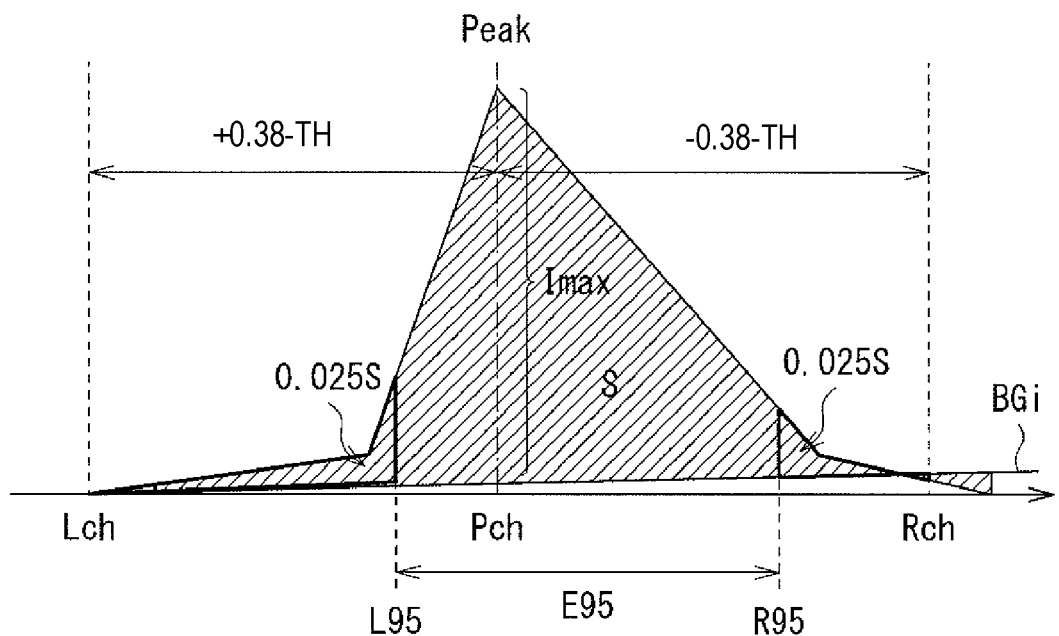
FIG. 13 schematically illustrates a first exemplary E95 calculation method based on the fringe waveform at the laser apparatus according to Embodiment 1.
Figure 14:
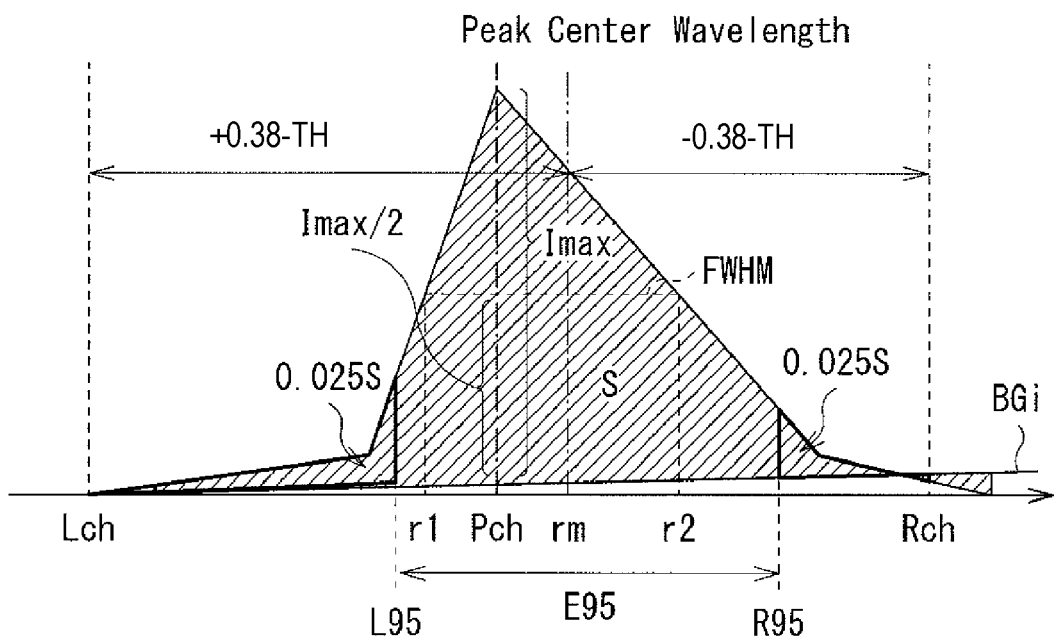
FIG. 14 schematically illustrates a second exemplary E95 calculation method based on the fringe waveform at the laser apparatus according to Embodiment 1.

FIG. 13 schematically illustrates a first exemplary method of calculating the spectral line width E95 (E95raw) based on the fringe waveform in the laser apparatus according to Embodiment 1. FIG. 14 schematically illustrates a second exemplary method of calculating the spectral line width E95 (E95raw) based on the fringe waveform in the laser apparatus according to Embodiment 1. In FIGS. 13 and 14, the horizontal axis represents the channel Ch of each line sensor in the image sensor 344 of the spectral line width meter 34A. The vertical axis represents the intensity of the fringe waveform.

In FIGS. 13 and 14, among both ends of the fringe waveform, a first end part is denoted by Lch, and a second end part is denoted by Rch. The peak position of the fringe waveform is represented by Pch.

When the spectral line width E95raw is to be calculated, the area corresponding to 95% as the first ratio in the entire area S of the spectral space of the fringe waveform is calculated. The area corresponding to 95% can be calculated by specifying a position for the area corresponding to 5% of the entire area S of the spectral space.

The spectrum measurement unit 70 specifies a first waveform position L95 at which the area obtained by integrating the fringe waveform from the first end part Lch is equal to a second ratio of the entire area S of the spectral space, and also specifies a second waveform position R95 at which the area obtained by integrating the fringe waveform from the second end part Rch is equal to the second ratio of the entire area S. The second ratio is 2.5% in calculation of the spectral line width E95raw. The area corresponding to 2.5% of the entire area S of the spectral space is 0.025S. Accordingly, positions for the areas at both end parts of the fringe waveform, which correspond to 2.5%×2=5% of the entire area S of the spectral space, are specified.

The spectrum measurement unit 70 regards the area between the first waveform position L95 and the second waveform position R95 in the fringe waveform as the area corresponding to 95% of the entire area S of the spectral space, and calculates the spectral line width E95raw.

The spectrum measurement unit 70 sets area of a predetermined range with respect to a center position of the fringe waveform as the entire area S of the spectral space. The predetermined range is, for example, the range of ±0.38-th order illustrated in FIGS. 13 and 14. The value of 0.38-th order corresponds to 0.5 pm.

FIG. 13 illustrates an example in which the spectral line width E95raw is calculated with the peak position of the fringe waveform set as the center position of the fringe waveform.

FIG. 14 illustrates an example in which the spectral line width E95raw is calculated with a center position rm as a wavelength center obtained from the full width at half maximum (FWHM) of the fringe waveform set as the center position of the fringe waveform. The center position rm of the full width at half maximum can be obtained by an expression below when r1 and r2 represent the positions of both ends of the full width at half maximum.

$$rm^2 = (r1^2 + r2^2)/2$$

Alternatively, the spectral line width E95raw may be calculated with the center position of the fringe waveform set to be a position corresponding to the barycenter of the fringe waveform.

FIG. 15 schematically illustrates an exemplary calibration function F(x) used in calculation of the spectral line width Δλ.

In FIG. 15, the horizontal axis represents E95 internally measured in the laser apparatus according to Embodiment 1 and corresponds to the spectral line width E95raw described above. The vertical axis represents E95 externally measured by an external spectrum meter.

The calibration function F(x) may be, for example, a first-order function such as "ax+b" where a and b are constants, a second-order function, a third-order function, or a higher-order function. Alternatively, the calibration function F(x) may be a polynomial such as "ax$^2$+bx$^2$+c" where a, b, are c are constants. Alternatively, the calibration function F(x) may be an exponential function such as ae$^{bx}$ where a and b are constants.

The calibration function F(x) may include a coefficient for calibrating wavelength dependency. For example, the calibration function F(x) may be a function as described below:

$$F(E95, WL) = a \cdot WL + b \cdot E95 + c$$

where WL is the wavelength and a, b, and c are constants.

In addition, the calibration function F(x) may include a coefficient for calibrating spectrum asymmetry dependency. For example, the calibration function F(x) may be a function as described below:

$$F(E95, Asym) = a \cdot Asym + b \cdot E95 + c$$

where Asym is spectrum asymmetry and a, b, and c are constants.

The other operation may be substantially same as that of the laser apparatus 101 according to the comparative example described above.

[2.3 Effect]

With the laser apparatus according to Embodiment 1, the speed of measurement of the spectral line width Δλ and the speed of control of the spectral line width Δλ are improved since the mapping processing and the deconvolution processing are not performed in calculation of E95 as the spectral line width Δλ. As a result, the stability of the spectral line width Δλ can be improved. In addition, sufficient measurement accuracy can be maintained through calibration with the calibration function F(x).

3. Embodiment 2 (Example in Which Calibration Function is Updated)

The following describes a laser apparatus according to Embodiment 2 of the present disclosure. In the following description, a component substantially same as that of the laser apparatus according to the comparative example or Embodiment 1 described above is denoted by the same reference sign, and description thereof is omitted as appropriate.

[3.1 Configuration]

The basic configuration of the laser apparatus according to Embodiment 2 is substantially same as that of the laser apparatus 101 according to the comparative example described above. However, the calculation operation of the spectral line width Δλ by the spectrum measurement unit 70 is partially different as described below.

[3.2 Operation]

In the laser apparatus according to Embodiment 2, similarly to the laser apparatus according to Embodiment 1, the spectrum measurement unit 70 calculates E95 as the spectral line width Δλ by using the calibration function F(x). In the laser apparatus according to Embodiment 2, the spectrum measurement unit 70 also performs processing of updating the calibration function F(x).

The spectrum measurement unit 70 performs deconvolution processing of a first spectral waveform obtained from the fringe waveform to calculate a second spectral waveform, and calculates a third spectral line width based on the calculated second spectral waveform. The first spectral waveform is a spectral waveform O(λ) generated at step S426 in FIG. 17 to be described later. The second spectral waveform is a true spectral waveform T(λ) calculated at step S428 in FIG. 17 to be described later. The third spectral line width is a spectral line width E95deco calculated at step S429 in FIG. 17 to be described later.

The spectrum measurement unit 70 performs update processing of the calibration function F(x) based on the relation between the first spectral line width calibrated based on the calibration function F(x) and the third spectral line width. The spectrum measurement unit 70 periodically repeats the update processing of the calibration function F(x). Specifically, the spectrum measurement unit 70 performs processing described below.

Figure 16:
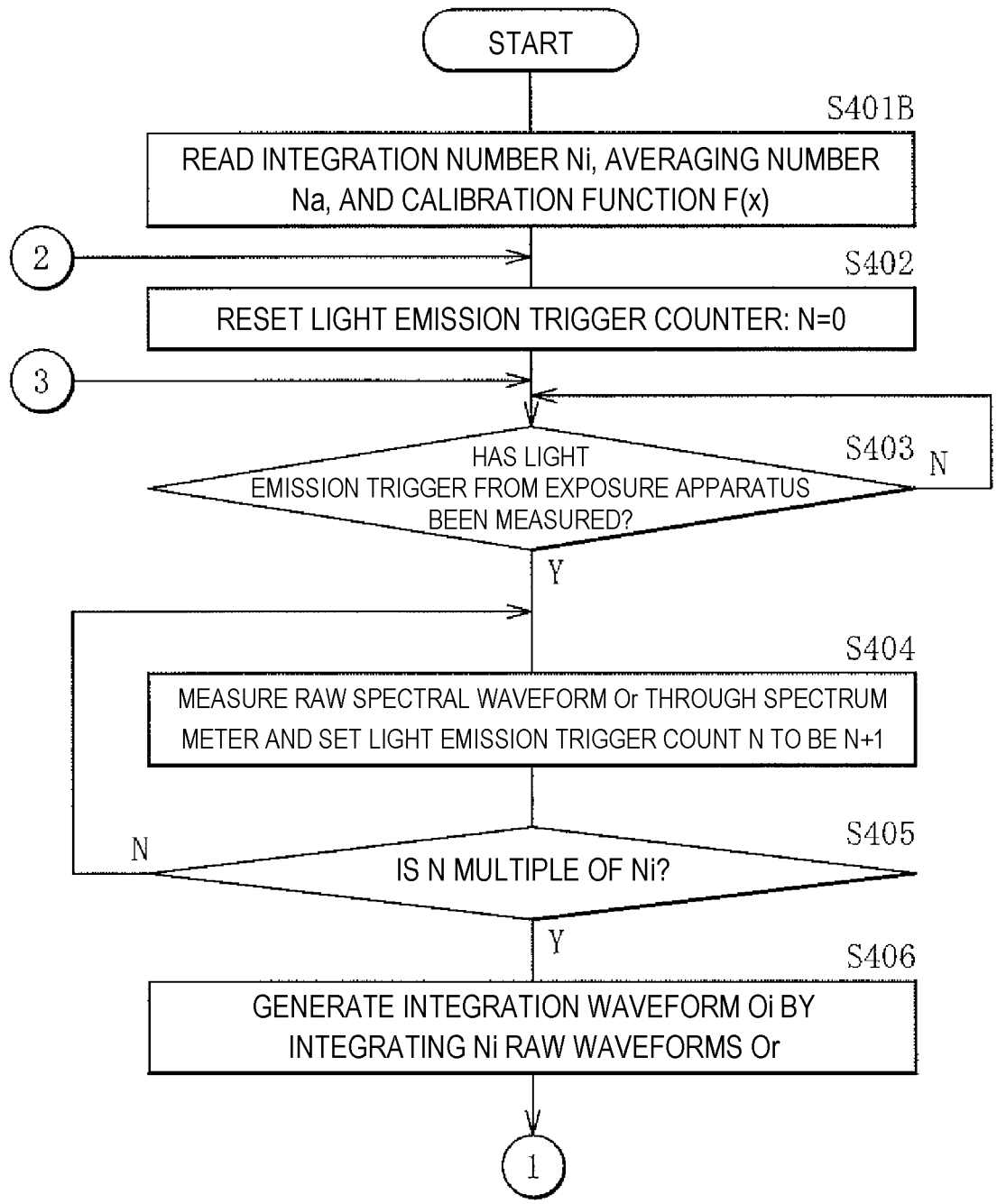
FIG. 16 is a flowchart illustrating an exemplary process of the spectrum-line-width measurement operation at the laser apparatus according to Embodiment 2.
Figure 17:
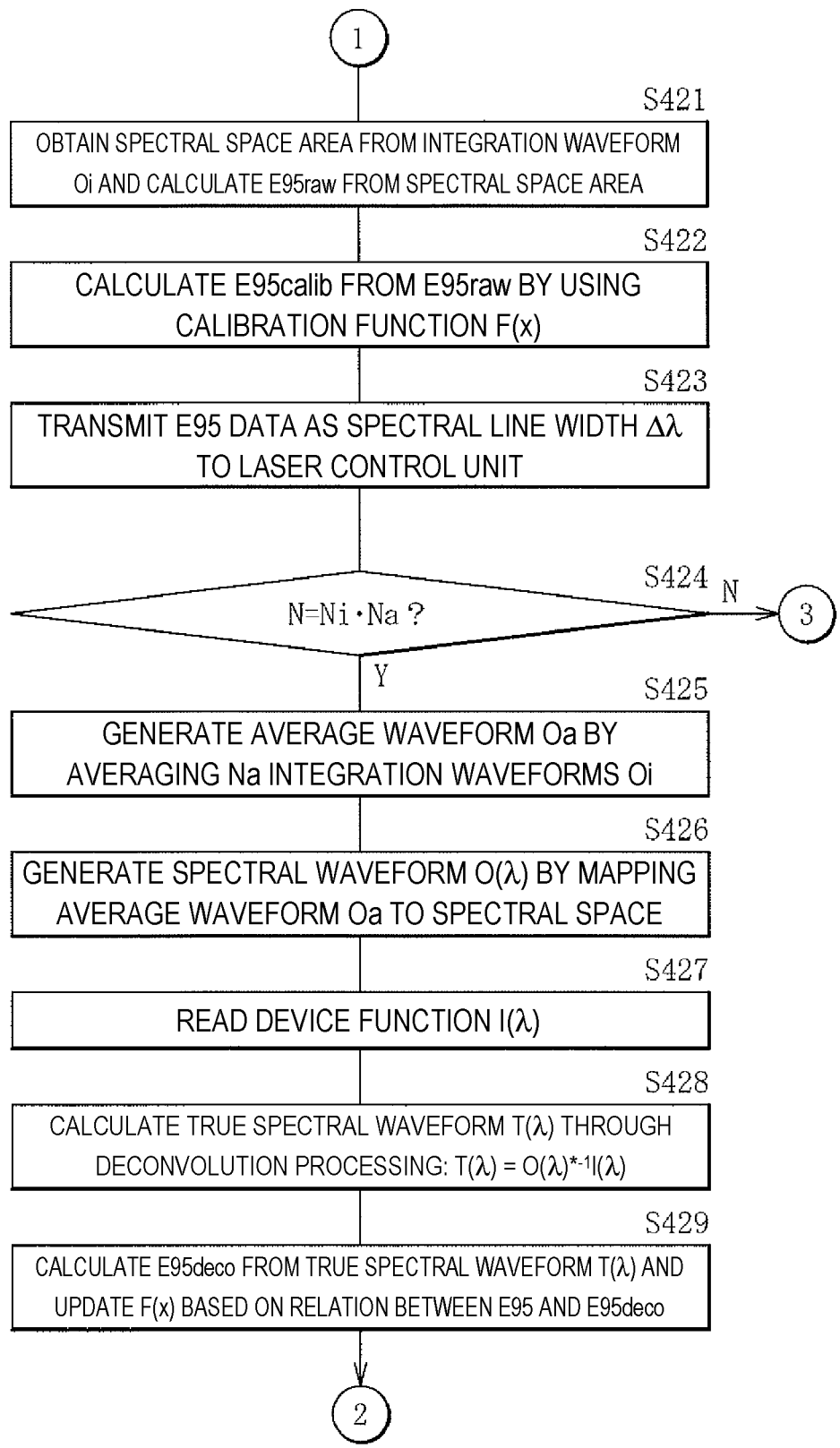
FIG. 17 is a flowchart following FIG. 16.

FIGS. 16 and 17 are each a flowchart illustrating an exemplary process of the measurement operation of the spectral line width Δλ in the laser apparatus according to Embodiment 2. The laser apparatus according to Embodiment 2 performs the measurement operation illustrated in FIGS. 9 and 10 in place of the measurement operation of the spectral line width Δλ illustrated in FIGS. 7 and 8. In FIGS. 16 and 17, a step of performing processing same as that at the corresponding step in the flowchart of FIGS. 7 and 8 is denoted by the same step number.

First, the spectrum measurement unit 70 reads data of the integration number Ni, the averaging number Na, and the calibration function F(x) from the memory unit 73 (step S401B).

Thereafter, the spectrum measurement unit 70 performs processing same as that at steps S402 to S406 in FIG. 7 to generate the integration waveform Oi obtained by integrating the Ni raw waveforms Or.

Subsequently, the spectrum measurement unit 70 obtains the area of the spectral space from the integration waveform Oi and calculates the spectral line width E95raw from the area of the spectral space (step S421 in FIG. 17). Similarly to Embodiment 1 described above, the area of the spectral space can be obtained as illustrated in FIG. 12. The spectral line width E95raw is the first spectral line width described above.

Subsequently, the spectrum measurement unit 70 calculates the spectral line width E95calib from the spectral line width E95raw by using the calibration function F(x) (step S422).

Subsequently, the spectrum measurement unit 70 sets E95 to be the calculated spectral line width E95calib and transmits data of E95 as the spectral line width Δλ to the laser control unit 2 (step S423).

Subsequently, the spectrum measurement unit 70 determines whether the counter value N of the light emission trigger counter is equal to the product (Ni·Na) of Ni and Na (N=Ni·Na) (step S424). When having determined that N=Ni·Na does not hold (N at step S407), the spectrum measurement unit 70 returns to the processing at step S403.

When having determined that N=Ni·Na holds (Y at step S407), the spectrum measurement unit 70 subsequently performs the processing at steps S425 to S428. The processing at steps S425 to S428 is same as steps S408 to S411 in FIG. 7.

Subsequently, the spectrum measurement unit 70 calculates the spectral line width E95deco from the true spectral waveform T(λ). Subsequently, the spectrum measurement unit 70 updates the calibration function F(x) based on the relation between E95 (E95calib) calculated at steps S422 and S423 and the spectral line width E95deco, and stores the updated calibration function F(x) in the memory unit 73 (step S429). Thereafter, the spectrum measurement unit 70 returns to the processing at step S402.

In the above description, the calibration function F(x) is updated each time the counter value N is reached, but may be updated once per a plurality of times of the E95 calculation, such as each time twofold (2N) or threefold (3N) of the counter value N is reached.

The other operation may be substantially same as that of the laser apparatus 101 according to the comparative example described above or the laser apparatus according to Embodiment 1 described above.

[3.3 Effect]

With the laser apparatus according to Embodiment 2, the speed of measurement of the spectral line width Δλ and the speed of control of the spectral line width Δλ are improved since the spectral line width Δλ is calculated by using the calibration function F(x) as in Embodiment 1. As a result, the stability of the spectral line width Δλ can be improved. In addition, the accuracy of measurement of the spectral line width Δλ can be further increased since the calibration function F(x) is periodically updated.

4. Embodiment 3 (Electronic-device Manufacturing Method)

The laser apparatus according to Embodiment 1 or 2 described above is applicable to a method of manufacturing an electronic device such as a semiconductor device. The following describes a specific example.

Figure 18:
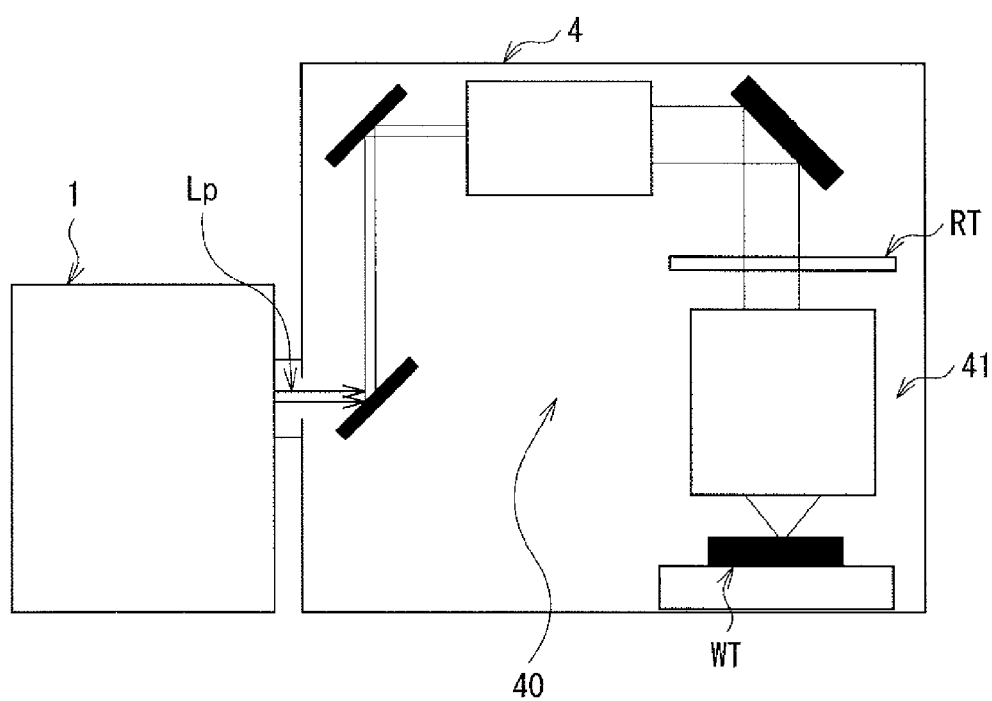
FIG. 18 schematically illustrates an exemplary configuration of an exposure apparatus used to manufacture a semiconductor device.

FIG. 18 schematically illustrates an exemplary configuration of the exposure apparatus 4 used to manufacture a semiconductor device.

In FIG. 18, the exposure apparatus 4 includes an illumination optical system 40 and a projection optical system 41.

The illumination optical system 40 illuminates a reticle pattern on a reticle stage RT with a laser beam incident from a laser system 1. The laser apparatuses according to Embodiments 1 to 3 described above are each applicable as the laser system 1.

The laser beam having transmitted through a reticle is subjected to reduced projection at the projection optical system 41 and imaged on a workpiece (not illustrated) disposed on a workpiece table WT.

The workpiece is a photosensitive substrate such as a semiconductor wafer on which photoresist is applied.

The exposure apparatus 4 moves the reticle stage RT and the workpiece table WT in parallel to each other in synchronization to expose the workpiece to the laser beam reflected by the reticle pattern.

A semiconductor device is manufactured through an exposure process as described above. The semiconductor device can be manufactured by transferring a device pattern onto a semiconductor wafer through the exposure process as described above.

5. Other

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An excimer laser apparatus comprising:
an etalon spectrometer configured to measure a fringe waveform of a laser beam; and
a controller configured to
perform spectral-line-width measurement by obtaining an area of a first ratio in a total area of the fringe waveform, calculating a first spectral line width of the laser beam based on the obtained area of the first ratio, and calibrating the first spectral line width based on a correlation function representing a correlation between the first spectral line width and a second spectral line width of the laser beam measured by a reference meter, and
perform update processing of the correlation function by performing deconvolution processing of a first spectral waveform obtained from the fringe waveform to calculate a second spectral waveform, calculating a third spectral line width based on the calculated second spectral waveform, and updating the correlation function based on a relation between the first spectral line width calibrated based on the correlation function and the third spectral line width.

2. The excimer laser apparatus according to claim 1, wherein
the controller sets an area of a predetermined range with respect to a center position of the fringe waveform as the total area of the fringe waveform.

3. The excimer laser apparatus according to claim 2, wherein
the controller sets a peak position of the fringe waveform as the center position of the fringe waveform.

4. The excimer laser apparatus according to claim 2, wherein
the controller sets a center position of full width at half maximum of the fringe waveform as the center position of the fringe waveform.

5. The excimer laser apparatus according to claim 2, wherein
the controller sets a barycenter of the fringe waveform as the center position of the fringe waveform.

6. The excimer laser apparatus according to claim 1, wherein
the controller calculates the area of the first ratio by dividing the fringe waveform into a plurality of divided wavelength intervals, calculating a divided area of each divided wavelength interval, and integrating the divided areas.

7. The excimer laser apparatus according to claim 1, wherein the controller
specifies a first waveform position at which an area integrated from a first end part of the fringe waveform has a second ratio in the total area, and a second waveform position at which an area integrated from a second end part of the fringe waveform has the second ratio, and
calculates the first spectral line width by regarding an area between the first waveform position and the second waveform position in the fringe waveform as the area of the first ratio.

8. The excimer laser apparatus according to claim 1, wherein
the first ratio is 95% of the total area.

9. The excimer laser apparatus according to claim 1, wherein
the controller repeats the update processing of the correlation function.

10. The excimer laser apparatus according to claim 1, wherein
the correlation function is an exponential function or a polynomial, the polynomial including at least two constants.

11. The excimer laser apparatus according to claim 1, wherein
the correlation function includes a coefficient for calibrating a wavelength dependency.

12. The excimer laser apparatus according to claim 1, wherein
the correlation function includes a coefficient for calibrating a spectrum asymmetry dependency.

13. An electronic-device manufacturing method comprising:
generating a laser beam by a laser system; the laser system including:
an etalon spectrometer configured to measure a fringe waveform of the laser beam; and
a controller configured to
perform spectral-line-width measurement by obtaining an area of a first ratio in a total area of the fringe waveform, calculating a first spectral line width of the laser beam based on the obtained area of the first ratio, and calibrating the first spectral line width based on a correlation function representing correlation between the first spectral line width and a second spectral line width of the laser beam measured by a reference meter, and
perform update processing of the correlation function by performing deconvolution processing of a first spectral waveform obtained from the fringe waveform to calculate a second spectral waveform, calculating a third spectral line width based on the calculated second spectral waveform, and updating the correlation function based on a relation between the first spectral line width calibrated based on the correlation function and the third spectral line width;

outputting the laser beam to an exposure apparatus; and exposing a photosensitive substrate to the laser beam by the exposure apparatus to manufacture an electronic device.

14. An excimer laser apparatus comprising:

an etalon spectrometer configured to measure a fringe waveform of a laser beam with an image sensor; and a controller configured to obtain an area of a first ratio in a total area of the fringe waveform, calculate a first spectral line width of the laser beam based on the obtained area of the first ratio, and calibrate the first spectral line width based on a correlation function representing a correlation between the first spectral line width and a second spectral line width of the laser beam measured by a reference meter, wherein the controller calculates the area of the first ratio by dividing the fringe waveform into a plurality of divided wavelength intervals corresponding to a plurality of channels of the image sensor, calculating a divided area of each divided wavelength interval, and integrating the divided areas.

15. The excimer laser apparatus according to claim 14, wherein the image sensor is a line sensor including a plurality of photodiodes, the photodiodes being linearly arranged, and the channels are the photodiodes.

16. The excimer laser apparatus according to claim 14, wherein the correlation function is an exponential function or a polynomial, the polynomial including at least two constants.

17. The excimer laser apparatus according to claim 14, wherein the correlation function includes a coefficient for calibrating a wavelength dependency.

18. The excimer laser apparatus according to claim 14, wherein the correlation function includes a coefficient for calibrating a spectrum asymmetry dependency.

* * * * *